United States Patent
Xu et al.

(10) Patent No.: US 11,758,780 B2
(45) Date of Patent: Sep. 12, 2023

(54) DISPLAY SUBSTRATE AND DISPLAY APPARATUS

(71) Applicant: BOE Technology Group Co., Ltd., Beijing (CN)

(72) Inventors: Pan Xu, Beijing (CN); Yicheng Lin, Beijing (CN); Ling Wang, Beijing (CN); Guoying Wang, Beijing (CN); Xing Zhang, Beijing (CN); Ying Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 268 days.

(21) Appl. No.: 17/273,290

(22) PCT Filed: May 29, 2020

(86) PCT No.: PCT/CN2020/093492
§ 371 (c)(1),
(2) Date: Mar. 3, 2021

(87) PCT Pub. No.: WO2021/237725
PCT Pub. Date: Dec. 2, 2021

(65) Prior Publication Data
US 2022/0254857 A1 Aug. 11, 2022

(51) Int. Cl.
*H01L 27/32* (2006.01)
*H10K 59/131* (2023.01)
(Continued)

(52) U.S. Cl.
CPC ......... *H10K 59/131* (2023.02); *G09G 3/3233* (2013.01); *G09G 3/3266* (2013.01);
(Continued)

(58) Field of Classification Search
CPC .. G02F 1/1345; G09G 3/3233; G09G 3/3266; G09G 2300/0426; G09G 2300/0842;
(Continued)

(56) References Cited

U.S. PATENT DOCUMENTS

| 2013/0207134 A1 | 8/2013 | Shin et al. |
| 2016/0027380 A1 | 1/2016 | Kim et al. |
| 2017/0061840 A1 | 3/2017 | Ko |

OTHER PUBLICATIONS

European Search Report for 20904248.0 dated Aug. 4, 2022.

*Primary Examiner* — Stacy Khoo
(74) *Attorney, Agent, or Firm* — Ling Wu; Stephen Yang; Ling and Yang Intellectual Property

(57) ABSTRACT

Provided are a display substrate and display apparatus. The display substrate includes a display region and non-display region; base substrate, driving structure layer and wiring layer. The driving structure layer located in the display region includes a first power supply line, data signal line and reference signal line extending along a first direction; the wiring layer located in the non-display region includes a first power supply wiring electrically connected to first power supply line and located on first side of the display region, a data wiring located on second side, different from the first side, of the display region, and a reference wiring located on second side of the display region. For the first power supply line, data signal line and reference signal line with the same length, resistance of first power supply line is greater than that of the data signal line and that of the reference signal line.

20 Claims, 10 Drawing Sheets

(51) Int. Cl.
G09G 3/3233 (2016.01)
G09G 3/3266 (2016.01)
G11C 19/28 (2006.01)
H01L 25/18 (2023.01)

(52) U.S. Cl.
CPC ............... *G09G 2300/0842* (2013.01); *G09G 2310/0286* (2013.01); *G11C 19/287* (2013.01); *H01L 25/18* (2013.01)

(58) Field of Classification Search
CPC ... G09G 2310/0281; G09G 2310/0286; G09G 2320/0223; H01L 27/3276; H01L 25/18; G11C 19/287
See application file for complete search history.

DISPLAY SUBSTRATE AND DISPLAY APPARATUS

CROSS-REFERENCE TO RELATED APPLICATION

The present application is a U.S. National Phase Entry of International PCT Application No. PCT/CN2020/093492, having an international filing date of May 29, 2020, the entire content of which is hereby incorporated by reference.

TECHNICAL FIELD

The present disclosure relates to, but is not limited to, the field of display, in particular to a display substrate and a display apparatus.

BACKGROUND

With the rapid development of display technology, to better adapt to the overall structure and usage requirements of an environment, requirements on the appearance of the displays are gradually increasing in addition to the traditional functions, such as information display, thus special-shaped displays are produced.

SUMMARY

The following is a summary of the subject matter described in detail in the present disclosure. This summary is not intended to limit the protection scope of the claims.

In a first aspect, the present disclosure provides a display substrate, which includes a display region and a non-display region. The display substrate includes: a base substrate, a driving structure layer and a wiring layer which are disposed on the base substrate; the driving structure layer is located in the display region, and the wiring layer is located in the non-display region; the driving structure layer includes: a first power supply line, a data signal line, and a reference signal line which extend along a first direction; and the wiring layer includes: a first power supply wiring, a data wiring and a reference wiring. The first power supply wiring is electrically connected to the first power supply line, the data wiring is electrically connected to the data signal line, and the reference wiring is electrically connected to the reference signal line.

The first power supply wiring is located on a first side of the display region, and the data wiring is located on a second side of the display region, wherein the second side is different from the first side; the data wiring and the reference wiring are located on a same side of the display region.

For the first power supply line, the data signal line, and the reference signal line with the same length, a resistance of the first power supply line is greater than that of the data signal line and greater than that of the reference signal line.

In some possible implementations, a line width of the first power supply line is greater than that of the data signal line and greater than that of the reference signal line.

In some possible implementations, the display substrate further includes a second power supply line and a second power supply wiring which are located in the non-display region.

The second power supply line is electrically connected to the second power supply wiring, the second power supply line extends along a second direction, and the second direction intersects with the first direction; the second power supply line and the second power supply wiring are located on a same side of the display region, and the second power supply wiring and the data wiring are located on a same side of the display region.

In some possible implementations, the second power supply line and the reference wiring are arranged in different layers, and there is an overlapping region between the orthographic projection of the second power supply line on the base substrate and that of the reference wiring on the base substrate.

The second power supply line is electrically connected to the reference wiring.

In some possible implementations, the display substrate further includes: a flexible circuit board, a source driving chip, and at least one bonding pad located in the non-display region; the bonding pad and the first power supply wiring are located on a same side of the display region, and the source driving chip and the data wiring are located on a same side of the display region; the source driving chip is located on one side, away from the display region, of the second power supply line.

The source driving chip is electrically connected to the data wiring and is configured to provide a data signal to the data signal line through the data wiring.

The flexible circuit board is electrically connected to the bonding pad and the second power supply wiring respectively, and is configured to supply power to the first power supply wiring through the bonding pad, and supply power to the second power supply wiring.

In some possible implementations, the display substrate further includes: a peripheral circuit board, a flexible signal line, a source driving chip and at least one bonding pad located in the non-display region; the bonding pad and the first power supply wiring are located on a same side of the display region, and the source driving chip and the data wiring are located on a same side of the display region; the source driving chip is located on one side, away from the display region, of the second power supply line.

The source driving chip is electrically connected to the data wiring and is configured to provide a data signal to the data signal line through the data wiring.

The peripheral circuit board is electrically connected to the bonding pad, the second power supply wiring, and the source driving chip through the flexible signal line respectively, and is configured to supply power to the first power wiring through the bonding pad, and supply power to the second power supply wiring, and provide a signal to the source driving chip.

In some possible implementations, the driving structure layer further includes: multiple first power supply connection lines located in the display region and extending along a second direction; the multiple first power supply connection lines and the first power supply line are arranged in different layers.

There is an overlapping region between the orthographic projection of at least one first power supply connection line on the base substrate and that of the first power supply line on the base substrate; each of the at least one first power supply connection line is electrically connected to the first power supply line.

In some possible implementations, the driving structure layer further includes: multiple scanning signal lines and multiple reset signal lines extending along a second direction, and multiple driving structures arranged in a matrix, and the first power supply line is arranged between two adjacent driving structures.

Herein, each driving structure includes: a first driving circuit, a second driving circuit, and a third driving circuit which are arranged along the second direction.

In some possible implementations, the display substrate further includes: a gate driving circuit located in the non-display region; the gate driving circuit is located on a third side of the display region, and the third side is different from the first and the second side.

The gate driving circuit is electrically connected to a scanning signal line and a reset signal line respectively, and is configured to provide a signal to the scanning signal line and the reset signal line.

The gate driving circuit includes multiple shift registers, each of which includes a first shift register and a second shift register; the first shift register is electrically connected to the scanning signal line, and is configured to provide a signal to the scanning signal line; the second shift register is electrically connected to the reset signal line, and is configured to provide a signal to the reset signal line; the multiple first shift registers are cascaded and the multiple second shift registers are cascaded.

In some possible implementations, the display substrate further includes a scanning wiring and a reset wiring; the scanning wiring is electrically connected to the scanning signal line and the gate driving circuit respectively, and the reset wiring is electrically connected to the reset signal line and the gate driving circuit respectively.

The gate driving circuit includes multiple shift register groups, each shift register group includes at least one shift register; all shift registers in each shift register group are arranged along the first direction.

Multiple shift register groups are arranged in a stepped manner, and a distance between adjacent shift registers along the second direction is greater than a sum of a length of the scanning wiring and a length of the reset wiring.

In some possible implementations, in each driving structure, the data signal lines includes a first data line, a second data line, and a third data line; the first data line is electrically connected to the first driving circuit, the second data line is electrically connected to the second driving circuit, and the third data line is electrically connected to the third driving circuit; the reference signal line is electrically connected to the first driving circuit, the second driving circuit, and the third driving circuit respectively.

The first data line and the second data line are located between the first driving circuit and the second driving circuit, and the second data line is located on one side, close to the second driving circuit, of the first data line; the third data line and the reference signal line are located between the second driving circuit and the third driving circuit, and the third data line is located on one side, close to the third driving circuit, of the reference signal line; or, the first data line and the reference signal line are located between the first driving circuit and the second driving circuit, and the first data line is located on one side, close to the second driving circuit, of the reference signal line; the second data line and the third data line are located between the second driving circuit and the third drive circuit, and the third data line is located on one side, close to the third driving circuit, of the second data line.

In some possible implementations, in each driving structure, the first driving circuit and the third driving circuit are mirror symmetrical with respect to a center line of the first data line and the third data line.

The display substrate includes: a first driving structure, a second driving structure, and a third driving structure which are adjacently arranged along the second direction.

The third driving circuit in the first driving structure and the first driving circuit in the second driving structure are mirror symmetrical with respect to a first power supply line located between the first driving structure and the second driving structure.

The third driving circuit in the second driving structure and the first driving circuit in the third driving structure is mirror symmetrical with respect to a first power supply line located between the second driving structure and the third driving structure.

In some possible implementations, the driving structure layer further includes: a first reference connection line and a second reference connection line which extend along the second direction.

The first reference connection line and the second reference connection line are arranged in different layers; the second reference connection line is electrically connected to the reference signal line and the first reference connection line respectively.

In some possible implementations, each driving structure includes two first reference connection lines arranged along the second direction and three second reference connection lines arranged along the second direction.

A first one of the two first reference connection lines is electrically connected to a first one and a second one of the three second reference connection lines respectively.

A second one of the two first reference connection lines is electrically connected to the second one and a third one of the three second reference connection lines respectively.

One of the three second reference connection lines is electrically connected to the reference signal line and the one of the three second reference connection lines and the reference signal line form a continuous integrated structure.

In some possible implementations, the display substrate further includes: a light-emitting structure layer located on one side, away from the base substrate, of the driving structure layer, and the light-emitting structure layer includes multiple light-emitting elements.

Each driving structure in the driving structure layer includes a pixel driving circuit configured to drive a light-emitting element to emit light.

The pixel driving circuit includes: a first transistor, a second transistor, a third transistor, and a storage capacitor; the second transistor is a driving transistor; the storage capacitor includes a first electrode plate and a second electrode plate.

A control electrode of the first transistor is electrically connected to a scanning signal line, a first electrode of the first transistor is electrically connected to a data signal line, and a second electrode of the first transistor is electrically connected to a first node; a control electrode of the second transistor is electrically connected to a first node, a first electrode of the second transistor is electrically connected to a first power supply line, and a second electrode of the second transistor is electrically connected to a second node; a control electrode of the third transistor is electrically connected to a reset signal line, a first electrode of the third transistor is electrically connected to a reference signal line, a second electrode of the third transistor is electrically connected to the second node, the first electrode plate of the storage capacitor is electrically connected to the second node, and the second electrode plate of the storage capacitor is electrically connected to the first node.

A first electrode of the light-emitting element is electrically connected to the second node, and a second electrode of the light-emitting element is electrically connected to a second power supply line.

In some possible implementations, the driving structure layer includes: a first insulating layer, an active layer, a second insulating layer, a first metal layer, a third insulating layer, and a second metal layer which are sequentially arranged along a direction perpendicular to the base substrate.

The active layer includes active layers of all transistors; the first metal layer includes: a first reference connection line, control electrodes of all transistors, a first electrode plate, a reset signal line, a scanning signal line, and a first power supply connection line; the second metal layer includes: a second reference connection line, a reference signal line, a data line, a second electrode plate, and first and second electrodes of all transistors.

In some possible implementations, the third insulating layer is provided with a first via exposing the first power electrical connection line and a second via exposing the first reference electrical connection line.

The first power supply line is electrically connected to the first power supply connection line through the first via, and the second reference connection line is electrically connected to the first reference connection line through the second via.

In some possible implementations, the second power supply line is disposed in a same layer as the scanning signal line.

A connection via exposing the second power supply line is arranged on the third insulating layer; the reference wiring is electrically connected to the second power supply line through the connection via.

In some possible implementations, the light-emitting structure layer includes: a first electrode, an organic light-emitting layer, and a second electrode; the first electrode is located on one side, close to the base substrate, of the organic light-emitting layer, the second electrode is located on one side, away from the base substrate, of the organic light-emitting layer; there is an overlapping region between the orthographic projection of the second electrode on the base substrate and that of the second power supply line on the base substrate, and the second electrode is electrically connected to the second power supply line.

In some possible implementations, a length of the data wiring is negatively correlated with a length of the data signal line.

In some possible implementations, a shape of the display region is circular, elliptical, fan-shaped, heart-shaped, triangular, or N-polygonal, wherein N is greater than 4.

In a second aspect, the present disclosure further provides a display apparatus, including the above display substrate.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

Figure 1:
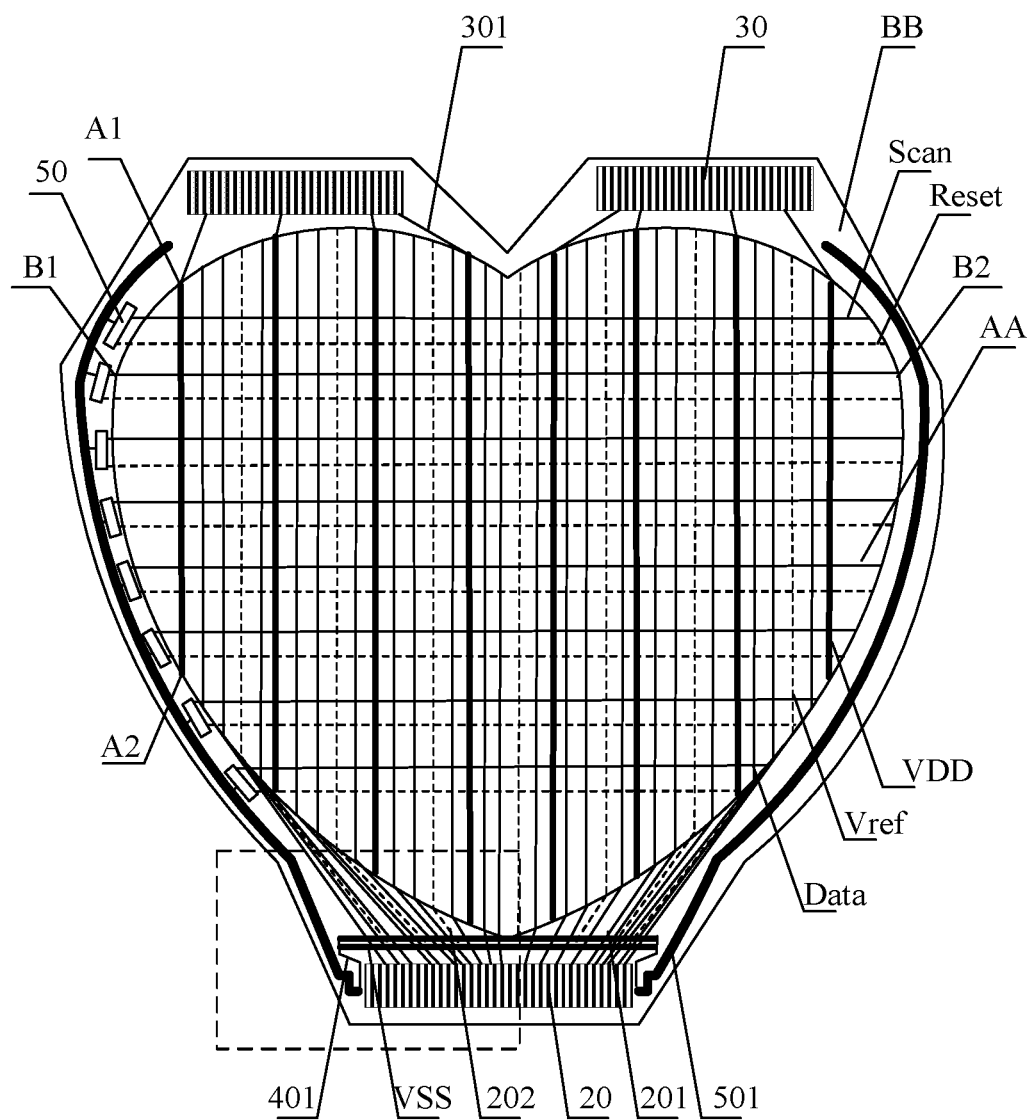
FIG. 1 is a schematic diagram of a structure of a display substrate provided by an embodiment of the present disclosure.

Hereinafter, embodiments of the present disclosure will be described in detail with reference to the accompanying drawings. Embodiments in the present disclosure and features in the embodiments may be combined with each other arbitrarily if there is no conflict.

Multiple embodiments are described in the present disclosure, but the description is exemplary rather than restrictive, and for those of ordinary skills in the art, there may be more embodiments and implementation solutions within the scope covered by the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or may replace any other feature or element of any other embodiment.

The present disclosure includes and envisages combinations of features and elements known to those of ordinary skills in the art. The embodiments, features and elements disclosed by the present disclosure may also be combined with any regular features or elements to form a technical solution as defined by the claims. Any feature or element of any embodiment may also be combined with features or elements from another technical solution to form another technical solution defined by the claims. Therefore, it should be understood that any of the features shown and/or discussed in the present disclosure may be implemented individually or in any suitable combination. Therefore, embodiments are not otherwise limited except by the limitations according to the appended claims and their equivalents. In addition, various modifications and changes can be made within the scope of protection of the appended claims.

Unless otherwise defined, technical terms or scientific terms used in the present disclosure shall have ordinary meanings understood by those of ordinary skills in the field to which the present disclosure belongs. Words such as "first", "second" and the like used in the present disclosure do not indicate any order, quantity or importance, but are only used to distinguish different constituent parts. Similar words such as "including" or "containing" mean that element(s) or article(s) appearing before the word cover elements or articles listed after the word and their equivalents, and do not exclude other elements or articles. Similar words such as "connected" or "coupled" are not limited to a physical or a mechanical connection, but may include an electrical connection, whether the connection is direct or indirect. "Up", "down", "left", "right", etc. are only used to represent a relative position relation that may be changed accordingly when an absolute position of an object being described changes.

A transistor is an element that includes at least three terminals, i.e., a gate electrode, a drain electrode and a source electrode. A transistor has a channel region between a drain electrode (drain terminal, drain region, or drain electrode) and a source electrode (source electrode terminal, source region, or source electrode), and a current can flow through the drain electrode, the channel region and the source electrode. In this specification, a channel region refers to a region which current mainly flows through. A first electrode may be a drain electrode and a second electrode may be a source electrode, or the first electrode may be a source electrode and the second electrode may be a drain electrode. Functions of the "source electrode" and the "drain electrode" are sometimes interchanged when transistors with opposite polarities are used or when the current direction changes during circuit operation. Therefore, in this specification, "source electrode" and "drain electrode" are interchangeable.

In this specification, an "electrical connection" includes a case where constituent elements are connected together through an element with certain electrical action. There's no particular limitation on "the element with certain electrical action" as long as it can transmit and receive electrical signals between constituent elements which are connected. Examples of "the element with certain electrical action" include not only electrodes and wiring, but also switching elements such as transistors, resistors, inductors, capacitors, and other elements with various functions.

In this specification, "parallel" refers to a state in which two straight lines form an angle above −10 degrees and below 10 degrees, and thus also includes a state in which the angle is above −5 degrees and below 5 degrees. In addition, "vertical" refers to a state in which an angle above 80 degrees and below 100 degrees is formed by two straight lines, and thus also includes a state in which the angle is above 85 degrees and below 95 degrees.

In this specification, "film" and "layer" are interchangeable. For example, sometimes "conductive layer" may be replaced with "conductive film". Similarly, "insulating film" may sometimes be replaced with "insulating layer".

A special-shaped display is a display with an irregular shape on the basis of a conventional display, so that the features of the display can better adapt to the overall structure and environment of a building. The currently common special-shaped screens mainly include fan-shaped, arc-shaped, circular, cylindrical, triangular and other structural forms.

In a special-shaped screen, because the quantity of pixels supplied by each column of power supply line is different, the voltage drop of each column of power supply line is hence different, which leads to uneven display of the special-shaped screen.

Figure 2:
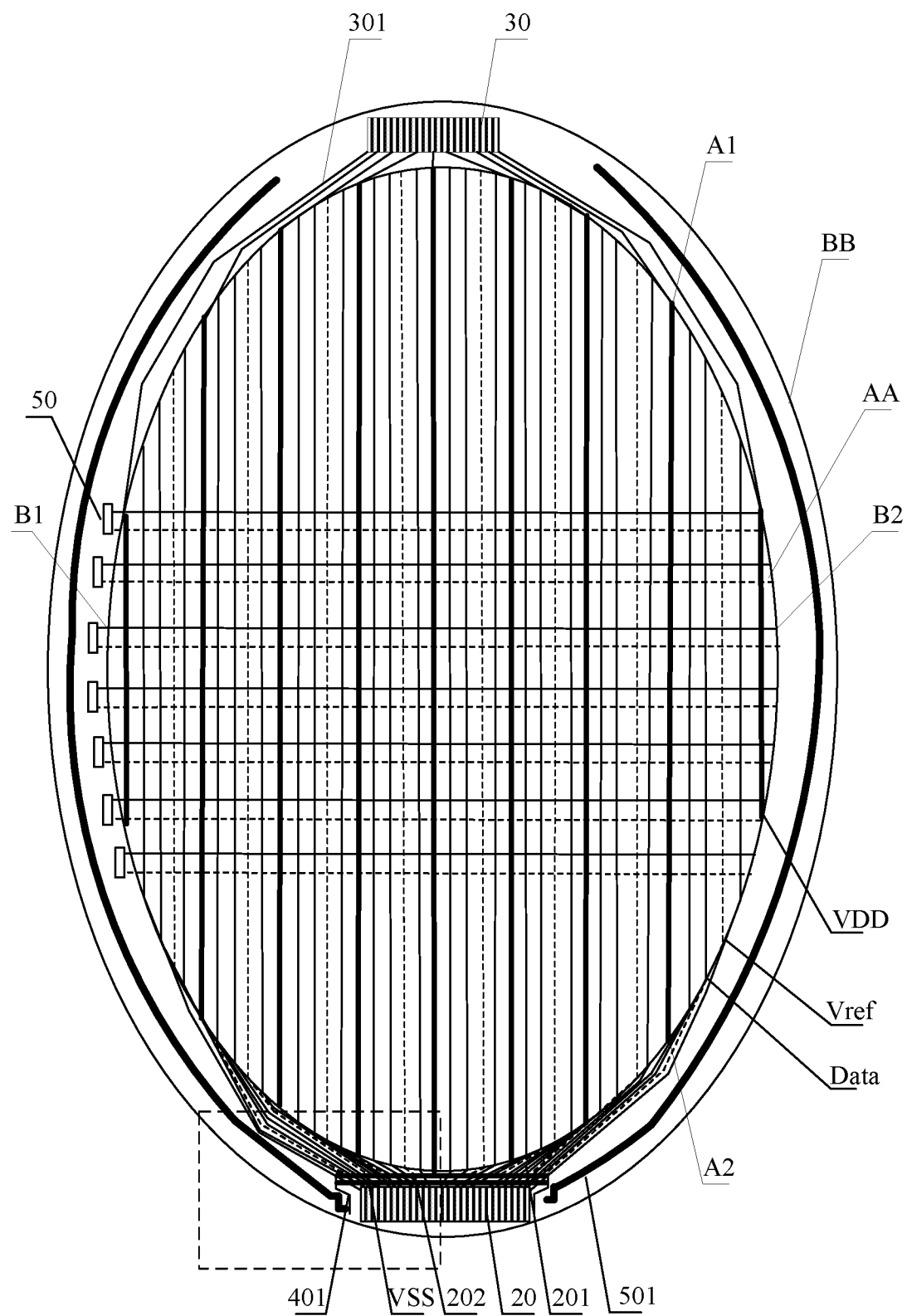
FIG. 2 is another schematic diagram of a structure of a display substrate provided by an embodiment of the present disclosure.
Figure 3:
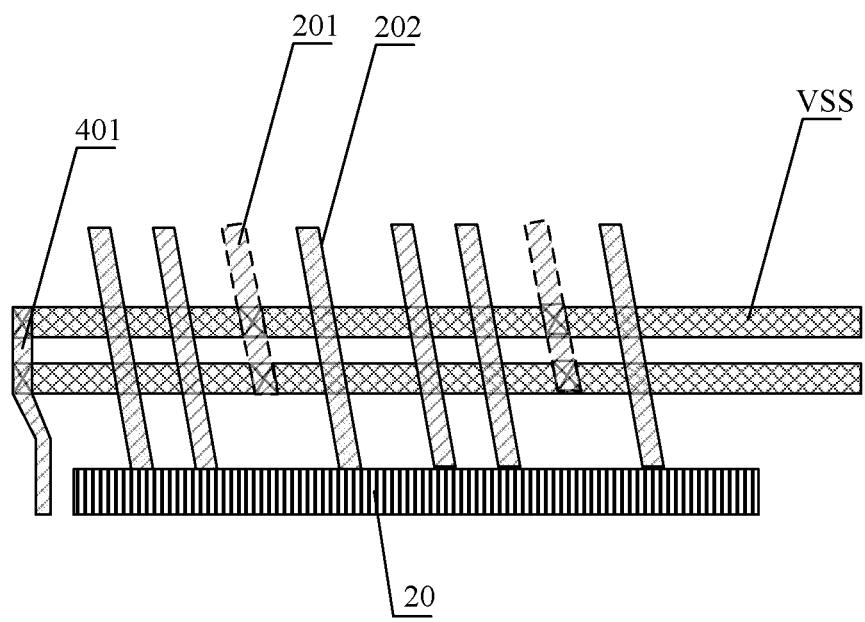
FIG. 3 is an enlarged schematic diagram of a part surrounded by dotted lines at the bottom of FIG. 1 and FIG. 2.

FIG. 1 is a schematic diagram of a structure of a display substrate provided by an embodiment of the present disclosure, FIG. 2 is another schematic diagram of a structure of a display substrate provided by an embodiment of the present disclosure, and FIG. 3 is an enlarged schematic diagram of a part surrounded by dotted lines at the bottom of FIG. 1 and FIG. 2. As shown in FIG. 1 to FIG. 3, a display substrate according to an embodiment of the present disclosure includes a display region AA and a non-display region BB. The display substrate includes: a base substrate, a driving structure layer and a wiring layer which are located in the display region and arranged on the base substrate. The driving structure layer is located in the display region AA, and the wiring layer is located in the non-display region BB. The driving structure layer includes a first power supply line VDD, a data signal line Data, and a reference signal line Vref which extend in a first direction. The wiring layer includes a first power supply wiring 301, a data wiring 201, and a reference wiring 202. The special-shaped edge of the display substrates in FIG. 1 and FIG. 2 are different. The special-shaped edge in FIG. 1 is heart-shaped, and the special-shaped edge in FIG. 2 is ellipse-shaped.

In an exemplary embodiment, the first power supply wiring 301 is electrically connected to the first power supply line VDD, the data wiring 201 is electrically connected to the data signal line Data, and the reference wiring 202 is electrically connected to the reference signal line Vref. The first power supply wiring 301 is located on a first side of the display region, and the data wiring 201 is located on a second side of the display region AA, wherein the first side is different from the second side, and the data wiring 201 and the reference wiring 202 are located on the same side of the display region.

In an exemplary embodiment, the first side and the second side may be two sides that are oppositely arranged, and the second side is a side away from the first side. A and B being oppositely arranged indicates that B is located on a side away from A.

As shown in FIG. 1 and FIG. 2, the first power supply line VDD includes a first terminal A1 and a second terminal A2 which are oppositely arranged. A first side refers to the side of the display region close to the first terminal A1 of the first power supply line VDD, and the second side refers to the side close to the second terminal A2 of the first power supply line VDD.

For the first power supply line VDD, the data signal line Data, and the reference signal line Vref with the same length, a resistance of the first power supply line VDD is greater than a resistance of the data signal line Data and greater than a resistance of the reference signal line Vref.

In an exemplary embodiment, the base substrate may be a rigid base substrate or a flexible base substrate, wherein the rigid base substrate may be, but is not limited to, one or more of glass and metal foil; the flexible base substrate may be, but is not limited to, one or more of polyethylene terephthalate, ethylene terephthalate, polyether ether ketone, polystyrene, polycarbonate, polyarylate, polyimide, polyvinyl chloride, polyethylene, and textile fibers.

In an exemplary embodiment, the first power supply line VDD is configured to continuously provide a high level power signal.

In an exemplary embodiment, the display region AA has a special-shaped edge. The non-display region BB surrounds the display region AA. The edge of the non-display region BB may be a special-shaped edge, and FIG. 1 and FIG. 2 illustrate the edge of the non-display region BB as a special-shaped edge.

In an exemplary embodiment, the number of the first power supply wirings 301 is greater than one, and the number of the first power supply lines VDD is greater than one. Multiple first power supply wirings 301 correspond to multiple first power supply lines VDD in a one-to-one manner. Each first power supply wiring 301 is connected to a corresponding first power supply line VDD.

In an exemplary embodiment, the first power supply wirings 301 and the first power supply lines VDD may be arranged in the same layer or in different layers.

In an exemplary embodiment, the number of data wirings 201 is greater than one, and the number of data signal lines Data is greater than one. Multiple data wirings 201 correspond to multiple data signal lines Data in a one-to-one manner. Each data wiring 201 is connected to a corresponding data signal line Data.

In an exemplary embodiment, the data wirings 201 and the data signal lines Data may be arranged in the same layer or in different layers.

In an exemplary embodiment, the number of reference wirings 202 is greater than one, and the number of reference signal lines Vref is greater than one. Multiple reference wirings 202 correspond to multiple reference signal lines Vref in a one-to-one manner. Each reference wiring 202 is connected to a corresponding reference signal line Vref.

In an exemplary embodiment, the reference wirings 202 and the reference signal lines Vref may be arranged in the same layer or in different layers.

In an exemplary embodiment, due to the unequal number of pixels connected by data signal lines in a special-shaped display substrate, there is a difference in the loads of the data signal lines, and the difference in loads will affect the display effect. Therefore, there is a negative correlation between the length of each data wiring and the length of the data signal line connected thereto; the longer the length of the data signal line, the shorter the length of the wiring connected thereto. That is, the difference in the loads of the data signal lines is compensated by the difference in the lengths of the data wirings.

The display substrate according to an embodiment of the present disclosure includes a display region and a non-display region, wherein the display substrate includes a base substrate as well as a driving structure layer and a wiring layer arranged on the base substrate; the driving structure layer is located in the display region, and the wiring layer is located in the non-display region; the driving structure layer includes a first power supply line, a data signal line, and a reference signal line which extend in a first direction; the wiring layer includes a first power supply wiring, a data wiring and a reference wiring; the first power supply wiring is electrically connected to the first power supply line, the data wiring is electrically connected to the data signal line, and the reference wiring is electrically connected to the reference signal line; the first power supply wiring is located on a first side of the display region, and a data wiring is located on the second side of the display region, wherein the second side is different from the first side; the data wiring and the reference wiring are located on the same side of the display region; for the first power supply line, data signal line and reference signal line with the same length, the resistance of the first power supply line is greater than the resistance of the data signal line and greater than the resistance of the reference signal line. In the technical solution according to an embodiment of the present disclosure, the narrow bezel of the special-shaped display substrate is realized by arranging the first power supply wiring and the data wiring on opposite sides of the display region.

In an exemplary embodiment, a line width of the first power supply line VDD is greater than that of the data signal line Data and greater than the line width of the reference signal line Vref, so that the resistance of the first power supply line VDD can be reduced.

In an exemplary embodiment, the greater the size of the display substrate is, the greater the line width of the first power supply line VDD is. For example, the line width of the first power supply line VDD in a 55-inch display substrate can be larger than ten microns.

As shown in FIG. 1 to FIG. 3, in an exemplary embodiment, the display substrate further includes a second power supply line VSS and a second power supply wiring 401 located in the non-display region BB.

The second power supply line VSS is electrically connected to the second power supply wiring 401, and the second power supply line VSS extends in a second direction. The second power supply line VSS and the second power supply wiring 401 are located on the same side of the display region AA, and the second power supply wiring 401 and the data wiring 201 are located on the same side of the display region AA.

In an exemplary embodiment, the second direction intersects the first direction, and a plane where the first direction and the second direction are located is a plane where the display substrate is located.

In an exemplary embodiment, the first direction is perpendicular to the second direction. The second power supply line VSS and the reference wiring 202 are arranged in different layers, and there is an overlapping region between an orthographic projection of the second power supply line VSS on the base substrate and an orthographic projection of the reference wiring 202 on the base substrate; the second power supply line VSS is electrically connected to the reference wiring 202.

In an exemplary embodiment, the second power supply line VSS is electrically connected to the reference signal line Vref through the reference wiring 202, which can not only ensure that the signals of the first electrode and the second electrode of a light-emitting element are equal when the pixel driving circuit initializes the first electrode of the light-emitting element, but also ensure the normal display of the display substrate, which improves the display effect of the display substrate and save the signal wiring.

In an exemplary embodiment, the second power supply line VSS and the second power supply wiring 401 may be arranged in the same layer or in different layers.

In an exemplary embodiment, the second power supply line VSS is configured to continuously provide a low level power signal.

In an exemplary embodiment, a voltage value of the power signal of the first power supply line VDD may be greater than a voltage value of the second supply line VSS.

As shown in FIG. 1 to FIG. 3, a display substrate provided by an exemplary embodiment may further include a flexible circuit board (not shown in the figure), a source driving chip 20 and at least one bonding pad 30 which are located in the non-display region BB.

The bonding pad 30 and the first power supply wiring 301 are located on a same side of the display region AA, and the source driving chip 20 and the data wiring 201 are located on a same side of the display region AA; the source driving chip 20 is located on one side of the second power supply line VSS away from the display region AA. The source driving chip is electrically connected to the data wiring 201, and is configured to provide a data signal to the data signal line Data through the data wiring 201.

The flexible circuit board is electrically connected to the bonding pad 30 and the second power supply wiring 401 respectively, and is configured to supply power to the first power supply wiring 301 through the bonding pad 30, and supply power to the second power supply wiring 401.

In an exemplary embodiment, the flexible circuit board may be disposed at any location of the display substrate.

The flexible circuit board starts supplying power to the first power supply wiring along the side of the first power supply line away from the source driver chip, and starts supplying power to the second power supply wiring along the side of the first power supply line close to the source driving chip, which can greatly reduce the sum of voltage drops of the first power supply line and the second power supply line and improve the display effect of the display substrate.

As shown in FIG. 1 to FIG. 3, in an exemplary embodiment, the display substrate may further includes: a peripheral circuit board, a flexible signal line, a source driving chip 20 and at least one bonding pad 30 which are located in the non-display region.

The bonding pad 30 and the first power supply wiring 301 are located on a same side of the display region AA, and the source driving chip 20 and the data wiring 201 are located on a same side of the display region AA; the source driving chip 20 is located on one side of the second power supply line VSS away from the display region AA. The source driving chip is electrically connected to the data wiring 201, and is configured to provide a data signal to the data signal line Data through the data wiring 201.

The peripheral circuit board is electrically connected to the bonding pad, the second power supply wiring, and the source drive chip through the flexible signal line, and is configured to supply power to the first power supply wiring through the bonding pad, and supply power to the second power supply wiring as well as to provide a signal to the source drive chip.

In an exemplary embodiment, one terminal of the flexible signal line is bound to the base substrate, and the other terminal is bound to the peripheral circuit board, and the peripheral circuit board supplies power to the first power supply wiring, the second power supply wiring, and the source driving chip arranged on the base substrate through the flexible signal line.

In an exemplary embodiment, the peripheral circuit board and the flexible signal line may be disposed at any position of the display substrate.

The peripheral circuit board and the flexible signal line start supplying power to the first power supply wiring along the side of the first power supply line away from the source driving chip, and start supplying power to the second power supply wiring along the side of the first power supply line close to the source driving chip, which can greatly reduce the sum of voltage drops of the first power supply line and the second power supply line and improve the display effect of the display substrate.

In an exemplary embodiment, the size of the bonding pad 30 is considered according to a process accuracy and an expansion amount, and the width of the bonding pad is 100 nm to 200 nm.

In an exemplary embodiment, the number of bonding pads is determined according to requirements of display. FIG. 1 illustrates two bonding pads as an example, and FIG. 2 illustrates one bonding pad as an example In an exemplary embodiment, the number of source driving chips may be determined according to the size of the display substrate; the greater the size of the display substrate, the greater the number of the source driving chips. FIG. 1 and FIG. 2 illustrate one source driving chip as an example.

Figure 4:
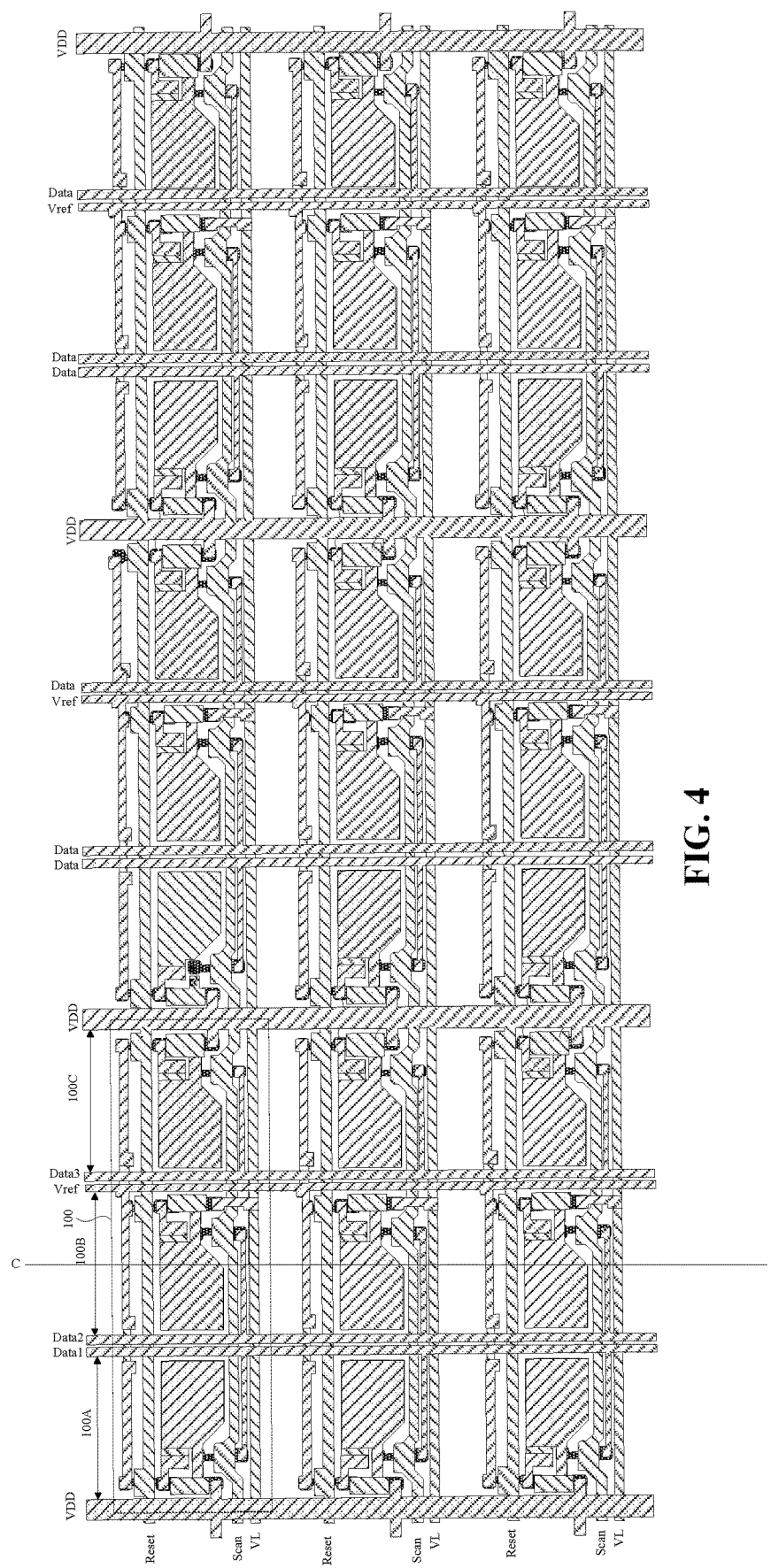
FIG. 4 is a schematic diagram of a partial display region of a display substrate provided by an exemplary embodiment.
Figure 5:
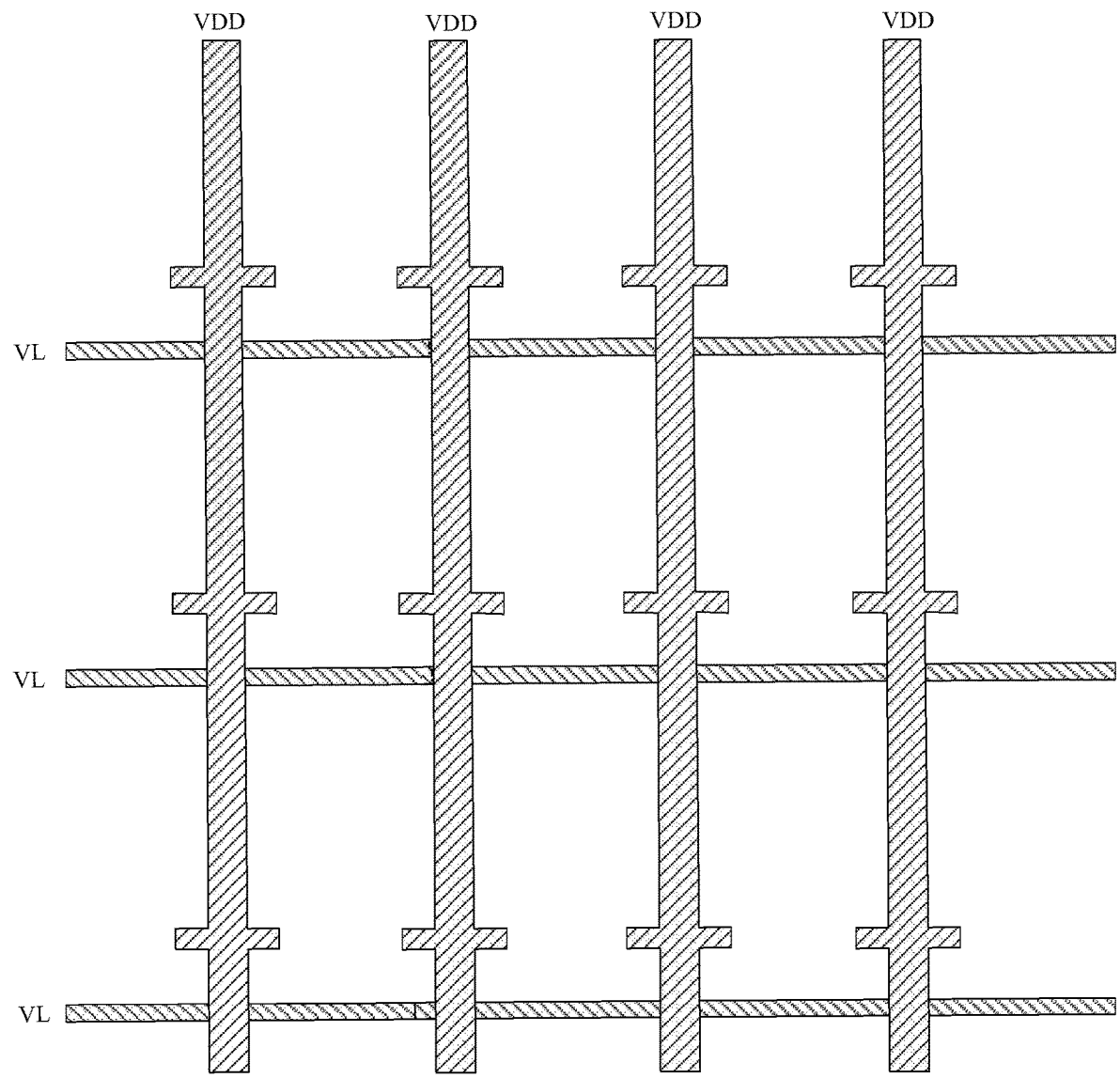
FIG. 5 is a top view of a first power supply line and a first power supply connection line in an exemplary embodiment.

FIG. 4 is a schematic diagram of a partial display region of a display substrate provided by an exemplary embodiment, and FIG. 5 is a top view of a first power supply line and a first power supply connection line in an exemplary embodiment. As shown in FIG. 4 and FIG. 5, the driving structure layer of the display substrate provided by an exemplary embodiment further includes multiple first power supply connection lines VL which are located in the display region AA and extend in a second direction.

The first power supply connection line VL and the first power supply line VDD are arranged in different layers. There is an overlapping region between an orthographic projection of at least one first power supply connection line VL on the base substrate and an orthographic projection of the first power supply line VDD on the base substrate. Each of the at least one first power supply connection line VL is electrically connected to the first power supply line VDD.

Each of the at least one first power supply connection line is electrically connected to the first power supply line, which can reduce the display unevenness of the display substrate caused by different voltage drops of different first power supply lines on the display substrate, and improve the display effect of the display substrate.

In an exemplary embodiment, the manufacturing material of the first power supply line VDD may be the same as or different from the manufacturing material of the first power supply connection line VL.

In an exemplary embodiment, the first power supply connection line VL may be disposed on a side of the first power supply line VDD close to the base substrate.

As shown in FIG. 4, the driving structure layer in the display substrate provided by an exemplary embodiment further includes multiple scanning signal lines Scan and multiple reset signal lines Reset which extend in the second direction, as well as multiple driving structures arranged in a matrix, and each first power supply line VDD is arranged between two adjacent driving structures. Each driving structure includes a first driving circuit 100A, a second driving circuit 100B, and a third driving circuit 100C arranged in a second direction.

In an exemplary embodiment, the driving structure layer may include M rows and N columns of driving structures, wherein M and N may be positive integers greater than 1. FIG. 4 illustrates three rows and three columns of driving structures in the driving structure layer as an example.

In an exemplary embodiment, the reset signal line Reset and the first power supply connection line VL are configured to define a row of driving structures, and the adjacent first power supply lines are configured to define a column of driving structures.

Figure 6:
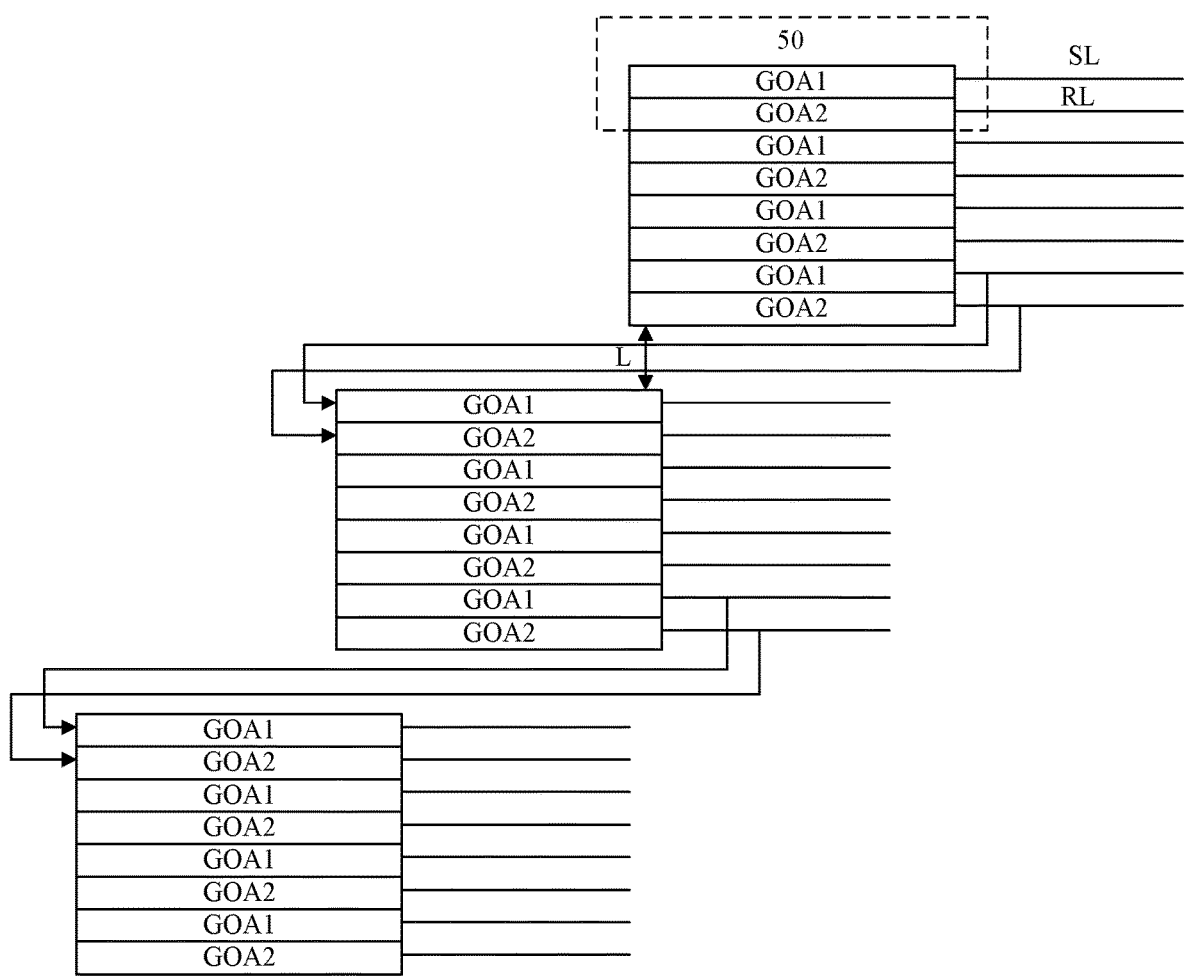
FIG. 6 is a schematic diagram of a gate driving circuit provided by an exemplary embodiment.

FIG. 6 is a schematic diagram of a gate driving circuit provided by an exemplary embodiment. As shown in FIG. 1, FIG. 2 and FIG. 6, a display substrate provided by an exemplary embodiment further includes a gate driving circuit located in a non-display region. The gate driving circuit is located on a third side of the display region, wherein the third side is a side different from the first side and the second side.

The gate driving circuit is electrically connected to the scanning signal line Scan and the reset signal line Reset respectively, and is configured to provide signals to the scanning signal line and the reset signal line.

The gate driving circuit includes multiple shift registers 50. The multiple shift registers are arranged along the edge of the display region. Each shift register 50 includes a first shift register GOA1 and a second shift register GOA2. The first shift register GOA1 is electrically connected to the scanning signal line Scan, and is configured to provide a signal to the scanning signal line Scan, and the second shift register GAO2 is electrically connected to the reset signal line Reset, and is configured to provide a signal to the reset signal line Reset. The multiple first shift registers GOA1 are cascaded, and the multiple second shift registers GOA2 are cascaded. The first shift register and the second shift register in each shift register are arranged in a first direction.

As shown in FIG. 6, in an exemplary embodiment, the display substrate further includes a scan wiring SL and a reset wiring RL; the scanning wiring SL is electrically connected to the scanning signal line and the gate driving circuit respectively, and the reset wiring RL is electrically connected to the reset signal line and the gate driving circuit respectively.

As shown in FIG. 6, in an exemplary embodiment, the gate driving circuit includes multiple shift register groups. Each shift register group includes at least one shift register; all the shift registers in each shift register group are arranged along the first direction. FIG. 6 illustrates a shift register group including four shift registers as an example. The number of shift registers included in each shift register group is related to the boundary of the display region.

As shown in FIG. 6, the multiple shift register groups are arranged in a stepped manner, and a distance L between adjacent shift registers in the second direction is greater than a sum of the length of the scanning wiring and the length of the reset wiring length. The smaller the distance between adjacent shift registers in the second direction, the easier it is for the display substrate to realize a narrow bezel.

In an exemplary embodiment, the multiple shift register groups are arranged around the edge of the display region, at least partially surrounding the display region.

In an exemplary embodiment, the arrangement of shift registers is determined according to the special-shaped boundary.

In an exemplary embodiment, the gate driving circuit is located on a third side of the display region. The scanning signal line Scan includes a first terminal B1 and a second terminal B2 which are oppositely arranged. The third side may be a side close to the first terminal B1 of the scanning signal line Scan or a side close to the second terminal B2 of the scanning signal line Scan.

In an exemplary embodiment, the gate driving circuit may be located on the same side of the display substrate as the bonding pad. In FIG. 1 and FIG. 2, the gate driving circuit, the bonding pad, and the source driving chip are located on different sides of the display substrate. Taking the heart-shaped display substrate provided in FIG. 1 as an example, the gate driving circuit may be arranged in the non-display region between two bonding pads.

In an exemplary embodiment, the display substrate may include two gate driving circuits respectively located on a third side and a fourth side of the display region. The two gate driving circuits have the same structure, and multiple shift registers in the two gate driving circuits correspond to each other in a one-to-one manner. The corresponding shift registers in the two gate driving circuits are connected to the same scanning signal line and the same reset signal line, and are configured to provide signals to the scanning signal line and the reset signal line in different stages, so that the service life of the display substrate can be prolonged.

In an exemplary embodiment, the peripheral circuit board is electrically connected to the gate driving circuit through a flexible signal line, and is configured to provide a signal to the gate driving circuit, wherein the signal includes a clock signal.

As shown in FIGS. 1 and 2, in an exemplary embodiment, the display substrate further includes a gate signal wiring 501. The gate signal wiring 501 is electrically connected to the flexible signal line and the gate driving circuit respectively.

In an exemplary embodiment, the display substrate further includes a flexible binding board. The flexible binding board can be a chip-on-film thin film.

In an exemplary embodiment, the source driving chip may be located on the flexible binding board.

In an exemplary embodiment, if the layout of the peripheral wiring of the display substrate is uncomplicated, all the peripheral layouts can be arranged on the flexible binding board. In this case, the flexible binding board can provide signals to a multi-channel control wiring, the first power supply wiring, the second power supply wiring, and the gate signal wiring, wherein the multi-channel control wiring is a control wiring of a multiplexer connected to a source driving chip.

In an exemplary embodiment, if the layout of the peripheral wirings of the display substrate is complicated, part of the peripheral wirings may be arranged on the flexible circuit board and part of the peripheral wirings may be arranged on the flexible binding board. In this case, the flexible circuit board may be connected to the first power supply wiring and the second power supply wiring, and the flexible binding board can provide signals to the multi-channel control wiring and gate signal wiring; or, the flexible circuit board can provide signals to the second power supply wiring and gate signal wiring, and the flexible binding board can provide signals to the first power supply wiring and the multi-channel control wiring.

In an exemplary embodiment, the source driving chip may be located on a glass substrate, and the flexible circuit board may be electrically connected to the multi-channel control wiring, the first power supply wiring, the second power supply wiring, and the gate signal wiring.

In an exemplary embodiment, as shown in FIG. 4, in each driving structure, data signal lines include: a first data line Data1, a second data line Data2, and a third data line Data3; wherein the first data line Data1 is electrically connected to a first driving circuit 100A, the second data line Data2 is electrically connected to a second driving circuit 100B, and the third data line Data3 is electrically connected to a third driving circuit 100C. The reference signal line Vref is electrically connected to the first driving circuit 100A, the second driving circuit 100B and the third driving circuit 100C respectively.

The first data line Data1 and the second data line Data2 are located between the first driving circuit 100A and the second driving circuit 100B, and the second data line Data2 is located on one side of the first data line Data1 close to the second driving circuit 100B; the third data line Data3 and the reference signal line Vref are located between the second driving circuit 100B and the third driving circuit 100C, and the third data line Data3 is located on the side of the reference signal line Vref close to the third driving circuit 100C; or, the first data line Data1 and the reference signal line Vref are located between the first driving circuit 100A and the second driving circuit 100B, and the first data line Data1 is located on one side of the reference signal line Vref close to the second driving circuit 100B; the second and third data lines Data2 and Data3 are located between the second driving circuit 100B and the third driving circuit 100C, and the third data line Data3 is located on one side of the second data line Data2 close to the third driving circuit 100C. FIG. 4 illustrates an example in which the first data line Data1 and the second data line Data2 are located between the first driving circuit 100A and the second driving circuit 100B.

In an exemplary embodiment, the data lines and the first power supply lines may be located on both sides of the driving circuit, or the data line and the first power supply line may be located between two driving circuits. FIG. 4 illustrates an example in which the data lines and the first power supply lines can be located on both sides of the driving circuit.

In an exemplary embodiment, as shown in FIG. 6, in each driving structure, the first driving circuit 100A and the third driving circuit 100C are mirror symmetrical with respect to the center line C of the first data line and the third data line.

In an exemplary embodiment, when the first data line Data1 and the second data line Data2 are located between the first driving circuit 100A and the second driving circuit 100B, the first driving circuit and the second driving circuit are arranged in mirror symmetrical with respect to the center line of the first data line and the second data line. When the first data line Data1 and the reference signal line Vref are located between the first driving circuit 100A and the second driving circuit 100B, the first driving circuit and the second driving circuit are mirror symmetrical with respect to the center line of the first data line and the reference signal line.

In an exemplary embodiment, as shown in FIG. 6, the display substrate includes a first driving structure, a second driving structure, and a third driving structure which are adjacently arranged in a second direction.

A third driving circuit in the first driving structure and a first driving circuit in the second driving structure are mirror symmetrical with respect to the first power supply line between the first driving structure and the second driving structure; a third driving circuit in the second driving structure and a first driving circuit in the third driving structure are mirror symmetrical with respect to the first power supply line between the second driving structure and the third driving structure.

In an exemplary embodiment, the display substrate further includes a light-emitting structure layer located on one side of the driving structure layer away from the base substrate. The light-emitting structure layer includes multiple light-emitting elements. Each driving circuit in the driving structure layer includes a pixel driving circuit configured to drive the light-emitting element to emit light, wherein the pixel driving circuit is electrically connected to the light-emitting element.

In an exemplary embodiment, the light-emitting element may be an organic light-emitting diode.

Figure 7:
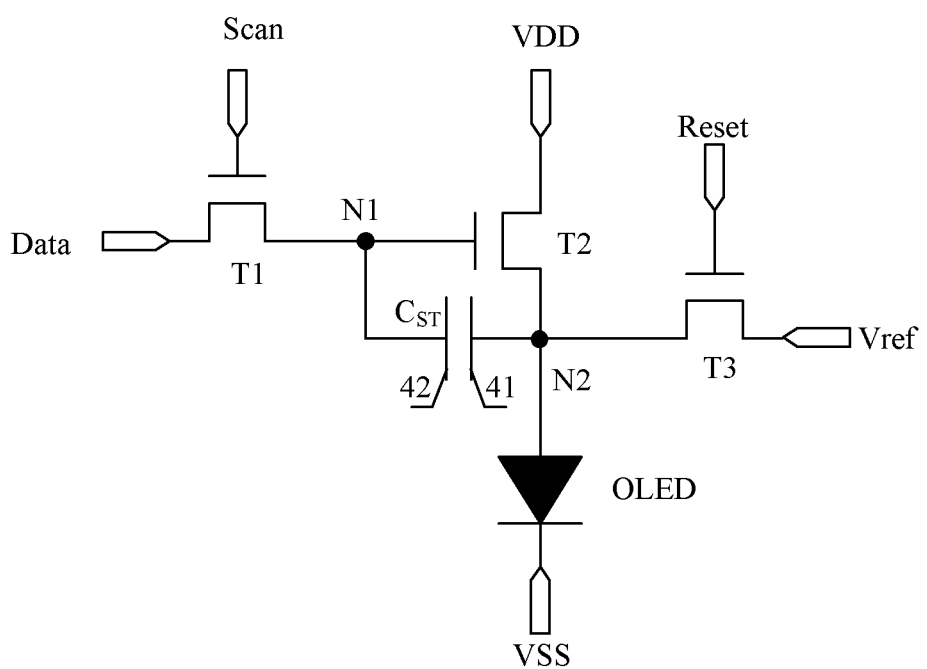
FIG. 7 is an equivalent circuit diagram of a pixel driving circuit provided by an exemplary embodiment.

FIG. 7 is an equivalent circuit diagram of a pixel driving circuit provided by an exemplary embodiment. As shown in FIG. 7, the pixel driving circuit includes a first transistor T1, a second transistor T2, a third transistor T3, and a storage capacitor $C_{ST}$. The first transistor T1 is a switching transistor, the second transistor T2 is a driving transistor, and the third transistor T3 is a reset transistor. The storage capacitor $C_{ST}$ includes a first electrode plate 41 and a second electrode plate 42.

A control electrode of the first transistor T1 is electrically connected to the scanning signal line Scan, a first electrode of the first transistor T1 is electrically connected to the data signal line Data, and a second electrode of the first transistor T1 is electrically connected to a first node N1. A control electrode of the second transistor T2 is electrically connected to the first node N1, a first electrode of the second transistor T2 is electrically connected to the first power supply line VDD, and a second electrode of the second transistor T2 is electrically connected to a second node N2. A control electrode of the third transistor T3 is electrically connected to the reset signal line Reset, a first electrode of the third transistor T3 is electrically connected to the reference signal line Vref, a second electrode of the third transistor T3 is electrically connected to the second node N2. The first electrode plate 41 of the storage capacitor $C_{ST}$ is electrically connected to the second node N2, and the second electrode plate 42 of the storage capacitor $C_{ST}$ is electrically connected to the first node N1. The first electrode of the light-emitting element OLED is electrically connected to the second node N2, and the second electrode of the light-emitting element is electrically connected to the second power supply line VSS.

In an exemplary embodiment, the line width of the second power supply line VSS is equal to the line width of the Data signal line Data, which can simplify the manufacturing process.

In this embodiment, the transistors T1 to T3 can all be N-type thin film transistors or P-type thin film transistors, which can unify the process flow, reduce the manufacturing process, and help to improve the yield of the display substrate.

Figure 8:
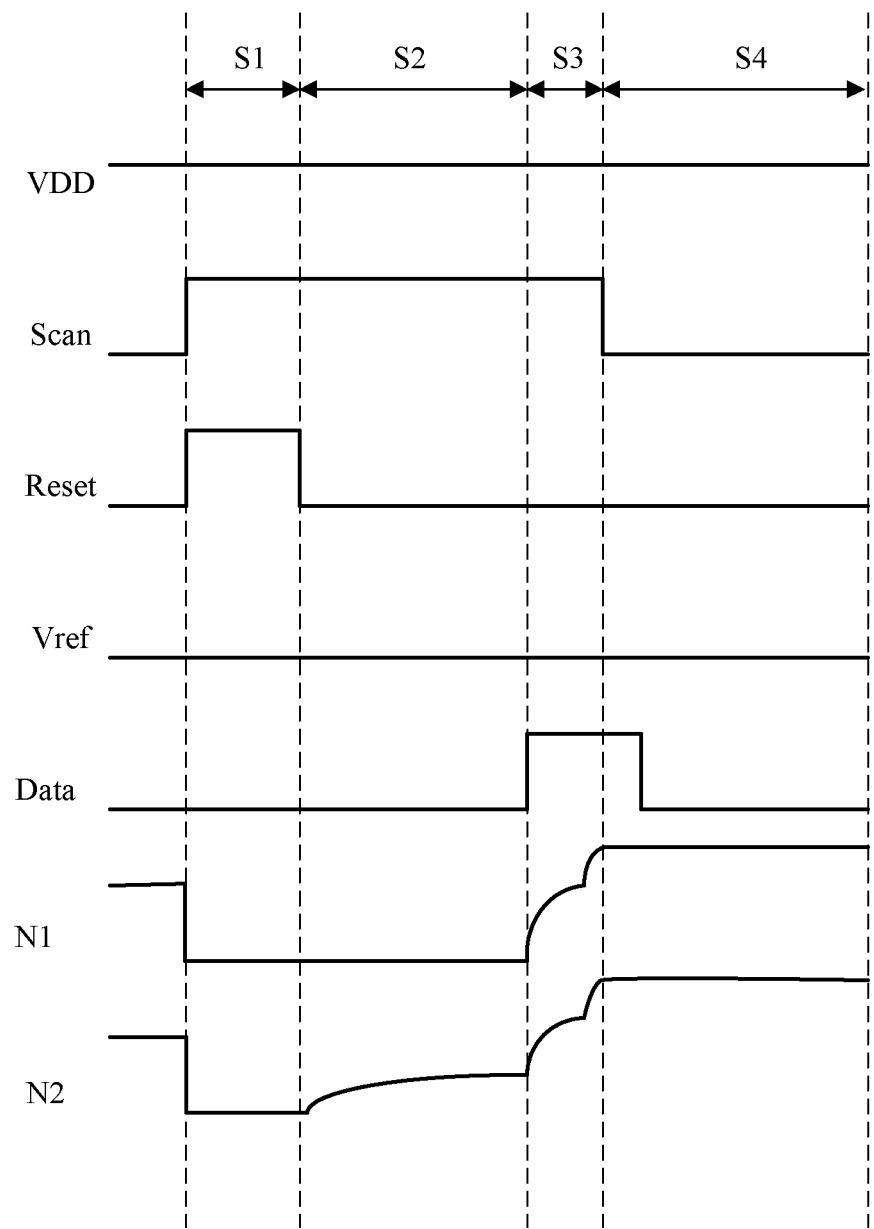
FIG. 8 is an operation sequence diagram of a pixel driving circuit provided by an exemplary embodiment.

Taking an example in which the transistors T1 to T3 in the pixel driving circuit according to an exemplary embodiment are all N-type thin film transistors, FIG. 8 is an operation sequence diagram of a pixel driving circuit provided by an exemplary embodiment. As shown in FIG. 7 and FIG. 8, an operation process of the pixel driving circuit according to an exemplary embodiment includes the following contents.

The first power supply line VDD continuously provides a high level signal, and the second power supply line VSS and the reference signal line Vref continuously provide low level signals.

In a first stage S1, i.e., a reset stage, the input signal of the scanning signal line Scan is a high level signal; the input signal of the reset signal line Reset is a high level signal; the input signal of the data signal line Data is a low level signal, the first transistor T1 is turned on, and the low level signal of data signal line Data is written into the first node N1; the third transistor T3 is turned on, and the low level signal of reference signal line Vref is written into the second node N2. Since the voltage of the second node N2 is the same as the voltage of the second power supply line VSS, the light-emitting element OLED does not emit light.

In a second stage S2, i.e., a compensation stage, the input signal of the scanning signal line Scan is a high level signal; the input signal of the reset signal line Reset is a low level signal, the input signal of the data signal line Data is a low level signal, the first transistor T1 is turned on, the low level signal of data signal line Data is written into the first node N1, and the third transistor T3 is turned off. Since a voltage difference between the signal of the first node N1 and the signal of the second node N2 is greater than the threshold voltage of the second transistor T2, the second transistor T2 is turned on, and the voltage of the second node N2 gradually rises until the voltage of the second node N2 is equal to the difference value between the signal voltage of the first node N1 and the threshold voltage of the second transistor T2. As the voltage of the second node N2 rises gradually, the more the mobility of the second transistor T2 increases, the more the voltage of the second node N2 rises, the smaller the threshold voltage of the second transistor T2 is, and the less the voltage of the second node N2 rises. Through the compensation stage, a current difference caused by different mobilities and threshold voltages of the second transistors T2 in different pixel driving circuits can be reduced, which can realize a compensation to the display uniformity of the display substrate, and can improve the display effect of the display substrate.

In a third stage S3, i.e., a writing stage, the input signal of scanning signal line Scan is a high level signal, the input signal of the reset signal line Reset is a low level signal, the input signal of data signal line Data is a high level signal, the first transistor T1 is turned on, and the high level signal of data signal line Data is written into the first node N1. The voltage value of the signal of the second node N2 will change accordingly due to the action of storage capacitor $C_{ST}$. Although the duration of this stage is short, the voltage value of the second node N2 will also be changed like the compensation stage, thus achieving an effect of recompensation.

In a fourth stage S4, i.e., a light-emitting stage, the input signal of the scanning signal line Scan is a low level signal, the input signal of the reset signal line Reset is a low level signal, the input signal of the data signal line Data is a low level signal, the first transistor T1 is turned off, the second transistor T2 is turned on, and a driving circuit is provided to the light-emitting element OLED, and the light-emitting element OLED emits light.

In an exemplary embodiment, the input signal of the data signal line Data changes from low level to high level within one frame, so that the frequency of the input signal of the data signal line Data is higher.

Figure 9:
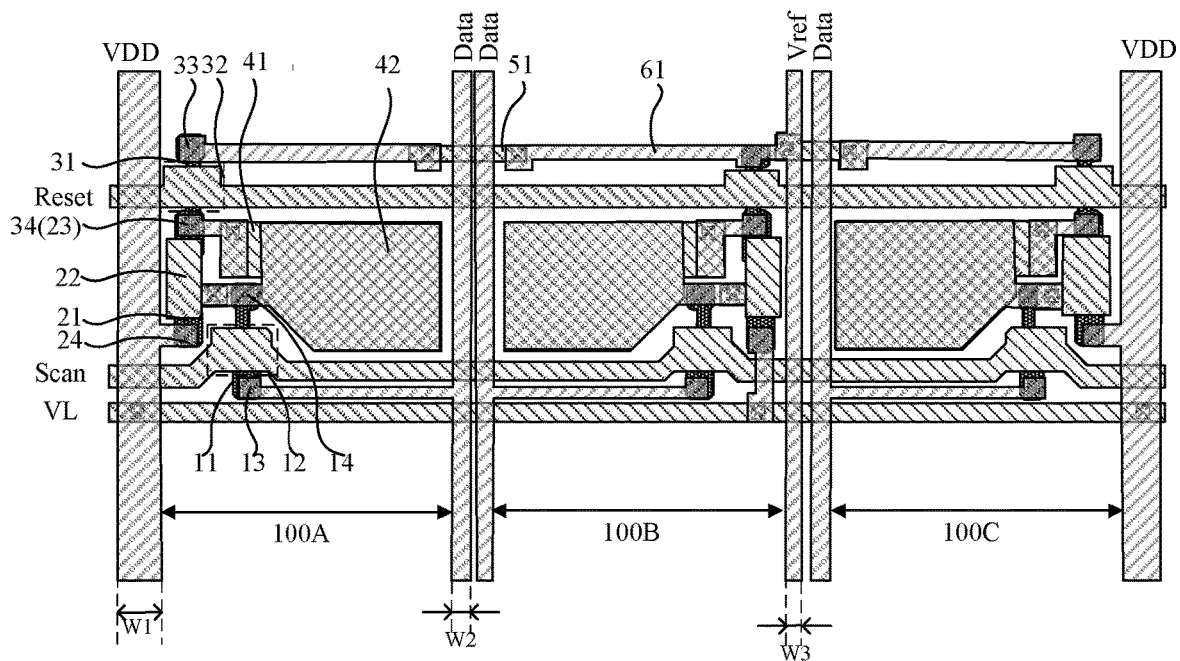
FIG. 9 is a layout diagram of a driving structure provided by an exemplary embodiment.

FIG. 9 is a layout diagram of a driving structure according to an exemplary embodiment. As shown in FIG. 9, in a display substrate according to an exemplary embodiment, a first transistor T1 includes a first active layer 11, a first gate electrode 12, a first source electrode 13, and a first drain electrode 14; a second transistor T2 includes a second active layer 21, a second gate electrode 22, a second source electrode 23, and a second drain electrode 24; a third transistor T3 includes a third active layer 31, a third gate electrode 32, and a third drain electrode 24. A storage capacitor includes a first electrode plate 41 and a second electrode plate 42. FIG. 9 illustrates an example in which a first electrode is a source electrode and a second electrode is a drain electrode.

As shown in FIG. 9, in an exemplary embodiment, the driving structure layer further includes a first reference connection line 51 and a second reference connection line 61 which extend in a second direction.

The first reference connection line 51 and the second reference connection line 61 are arranged in different layers, and the second reference connection line 61 is electrically connected to the reference signal line Vref and the first reference connection line 51 respectively.

As shown in FIG. 9, in an exemplary embodiment, each driving structure includes two first reference connection lines arranged in a first direction and three second reference connection lines arranged in the first direction.

There is an overlapping region between an orthographic projection of a first one of the two first reference connection lines on the base substrate and an orthographic projection of the first data line and the second data line on the base substrate. There is an overlapping region between an orthographic projection of a second one of the two first reference connection lines on the base substrate and an orthographic projection of the third data line and the reference signal line on the base substrate. The first one of the two first reference connection lines is electrically connected to a first one and a second one of the three second reference connection lines respectively; the second one of the two first reference connection lines is electrically connected to the second one and the third one of the three second reference connection lines respectively; the second one of the three second reference connection lines is connected to the reference signal line and they form a continuous integrated structure.

In an exemplary embodiment, the scanning signal line Scan is electrically connected to the first gate electrode 12 of the first transistor T1 in each driving structure, the reset signal line Reset is electrically connected to the third gate electrode 32 of the third transistor T3 in each driving structure, the data signal line Data is electrically connected to the first source electrode 13 of the first transistor T1 in each driving structure, and the first reference connection line 51 and the second reference connection line 61 are configured to make the third source electrode 33 of the third transistor T3 electrically connect with the reference signal line Vref. Taking the pixel driving circuit of the first driving structure 100A as an example, the first gate electrode 12 of the first transistor T1 is electrically connected to the scanning signal line Scan, the first source electrode 13 of the first transistor T1 is electrically connected to the data signal line Data, and the first drain electrode 14 of the first transistor T1 is electrically connected to the second gate electrode 22 of the second transistor T2. The second gate electrode 22 of the second transistor T2 is electrically connected to the first drain electrode 14 of the first transistor T1, the second source electrode 23 of the second transistor T2 is electrically connected to the third drain electrode 34 of the third transistor T3 and the first electrode of light-emitting element, the second drain electrode 24 of the second transistor T2 is electrically connected to the first power supply line VDD, the third gate electrode 32 of the third transistor T3 is electrically connected to the reset signal line Reset, the third source electrode 33 of the third transistor T3 is electrically connected to the reference signal line Vref through the first reference connection line 51 and the second reference connection line 61, and the third drain electrode 34 of the third transistor T3 is electrically connected to the second source electrode 23 of the second transistor T2 and the first electrode of the light-emitting element. The first electrode plate 41 is electrically connected to the second source electrode 23 of the second transistor T2 and the third drain electrode 34 of the third transistor T3, and the second electrode plate 42 is electrically connected to the first drain electrode 14 of the first transistor T1 and the second gate electrode 22 of the second transistor T2.

In an exemplary embodiment, the driving structure layer includes: a first insulating layer, an active layer, a second insulating layer, a first metal layer, a third insulating layer, and a second metal layer which are sequentially arranged along a direction perpendicular to the base substrate.

The active layer includes active layers of all transistors. The active layer of each transistor is arranged on the same layer and formed in the same patterning process. The first metal layer includes: a first reference connection line, control electrodes of all transistors, a first electrode plate, a reset signal line, a scanning signal line, and a first power supply connection line. The first reference connection line, the control electrodes of all transistors, the first electrode plate, the reset signal line, the scanning signal line, and the first power supply connection line are arranged on the same layer and formed in the same patterning process. The second metal layer includes: a second reference connection line, a reference signal line, a data line, a second electrode plate, and first and second electrodes of all transistors. The second reference connection line, the reference signal line, the data line, the second electrode plate and the first and second electrodes of all transistors are arranged on the same layer and formed in the same patterning process.

Taking the transistors in the pixel driving circuit shown in the figures are all N-type transistors as an example, that is, each transistor is turned on when the gate is applied with a high level (on level), and is turned off when the gate is applied with a low level (off level). In this case, the first electrode of the transistor may be a source, and the second electrode of the transistor may be a drain.

The pixel driving circuit includes, but is not limited to, a configuration mode shown in FIG. 7. For example, N-type transistors or a mixture of P-type transistors and N-type transistors may be used as various transistors in the pixel driving circuit, as long as the port polarity of the selected type of transistors is connected according to the port polarity of the corresponding transistors in the embodiment of the disclosure.

Transistors used in the pixel driving circuit may be thin film transistors, field effect transistors, or other switching devices with the same characteristics. Herein, thin film transistors are taken as an example. For example, the active layer (channel region) of the transistor uses semiconductor materials, such as polysilicon (such as low-temperature polysilicon or high-temperature polysilicon), amorphous silicon, indium gallium tin oxide (IGZO), while the gate, source, and drain electrodes use metal materials, such as metallic aluminum or aluminum alloy. The source and drain of the transistor used here may be symmetrical in structure, so there may be no difference between the source and drain in structure. In an embodiment of the present disclosure, in order to distinguish the two electrodes of the transistor except the gate, one electrode is directly described as the first electrode, and the other electrode is directly described as the second electrode. In addition, in an embodiment of the present disclosure, the electrodes of the capacitor may be metal electrodes, or one of the electrodes may use a semiconductor material (e.g., doped polysilicon).

In an exemplary embodiment, the first transistor T1 in all driving circuits in each driving structure is located on a side, close to the first power supply connection line VL, of the second electrode plate 42, and the third transistor T3 is located on a side, away from the first power supply connection line VL, of the second electrode plate 42.

In an exemplary embodiment, in each driving structure, the first transistor in the first driving circuit and the first transistor in the third driving circuit are mirror symmetrical with respect to a center line of two first power supply lines on both sides of the driving structure; the second transistor in the first driving circuit and the second transistor in the third driving circuit are mirror symmetrical with respect to a center line of two first power supply lines on both sides of the driving structure; the third transistor in the first driving circuit and the third transistor in the third driving circuit are mirror symmetrical with respect to a center line of two first power supply lines on both sides of the driving structure.

In an exemplary embodiment, when a first data line and a second data line are arranged between the first and second driving circuits, the first transistor in the first driving circuit and the first transistor in the second driving circuit are mirror symmetrical with respect to a center line of the first and the second data lines; the second transistor in the first driving circuit and the second transistor in the second driving circuit are mirror symmetrical with respect to the center line of the first and the second data lines; the third transistor in the first driving circuit and the third transistor in the second driving circuit are mirror symmetrical with respect to the center line of the first and the second data lines. When a first data line and a reference signal line are arranged between the first and second driving circuits, the first transistor in the first driving circuit and the first transistor in the second driving circuit are mirror symmetrical with respect to a center line of the first data line and the reference signal line; the second transistor in the first driving circuit and the second transistor in the second driving circuit are mirror symmetrical with respect to the center line of the first data line and the reference signal line; the third transistor in the first driving circuit and the third transistor in the second driving circuit are mirror symmetrical with respect to the center line of the first data line and the reference signal line.

In an exemplary embodiment, the driving structure layer further includes a flat layer located on a side, away from the base substrate, of the second metal layer; a via is arranged on the flat layer, and the via on the flat layer exposes the second source electrode of the second transistor T2.

In an exemplary embodiment, the light-emitting structure layer includes: a first electrode, an organic light-emitting layer, and a second electrode. The first electrode is located on a side, close to the base substrate, of the organic light-emitting layer, and the second electrode is located on a side, away from the base substrate, of the organic light-emitting layer. The first electrode is electrically connected to the second source electrode of the second transistor T2 through the via on the flat layer.

In an exemplary embodiment, as shown in FIG. 9, the third insulating layer is provided with a first via exposing the first power supply connection line VL and a second via exposing the first reference connection line 51. The first power supply line VDD is electrically connected to the first power supply connection line VL through the first via; and the second reference connection line 61 is electrically connected to the first reference connection line 51 through the second via.

In an exemplary embodiment, as shown in FIGS. 1-3, the second power supply line VSS is disposed in the same layer as the scanning signal line Scan. A connection via exposing the second power supply line is arranged on the third insulating layer, and the reference wiring is electrically connected to the second power supply line through the connection via.

In an exemplary embodiment, there is an overlapping region between an orthographic projection of the second electrode on the base substrate and that of the second power supply line on the base substrate, and the second electrode is electrically connected to the second power supply line.

In an exemplary embodiment, a shape of the display region may be axial symmetrical or may be non-axial symmetrical. When the shape of the display region is axial symmetrical, the symmetry axis may extend in the first direction or in the second direction.

In an exemplary embodiment, the shape of the display region may be circular, elliptical, fan-shaped, heart-shaped, triangular or N-polygonal, wherein N is greater than 4.

The structure of the display substrate according to an exemplary embodiment will be described as following through the preparation process of the display substrate. The "patterning process" includes processes, such as film layer deposition, photoresist coating, mask exposure, development, etching, and photoresist stripping. Deposition may be implemented by any one or more of sputtering, evaporation, and chemical vapor deposition, coating may be implemented by any one or more of spraying and spin coating, and etching may be implemented by any one or more of dry etching and wet etching. "Thin film" refers to a layer of thin film fabricated by a certain material on a base substrate using deposition or coating process. If the "thin film" does not need a patterning process during the whole manufacturing process, the "thin film" may also be called a "layer". If the "thin film" needs a patterning process throughout the whole manufacturing process, it is referred to as a "thin film" before the patterning process and as a "layer" after the patterning process. In the present disclosure, "A and B are arranged on the same layer" indicates that A and B are formed at the same time in the same patterning process.

Figure 10:
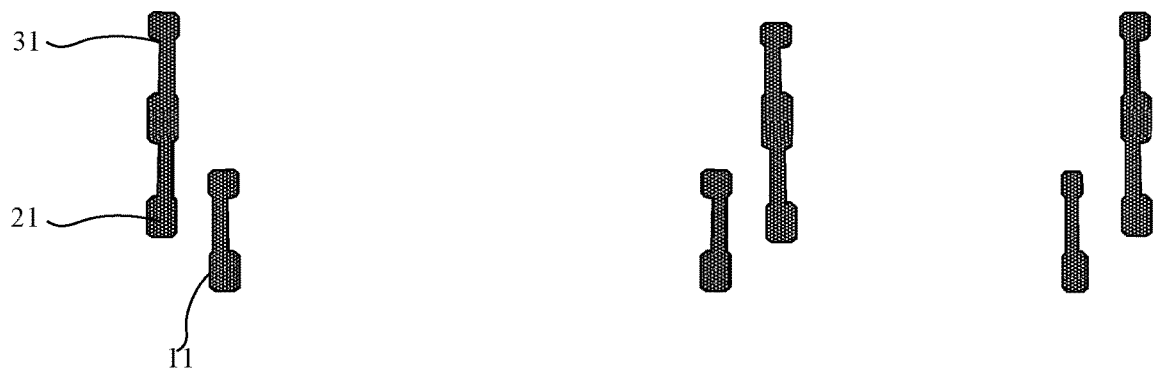
FIG. 10 to FIG. 12 are schematic diagrams of a preparation process of a display substrate provided by an exemplary embodiment.
Figure 11:
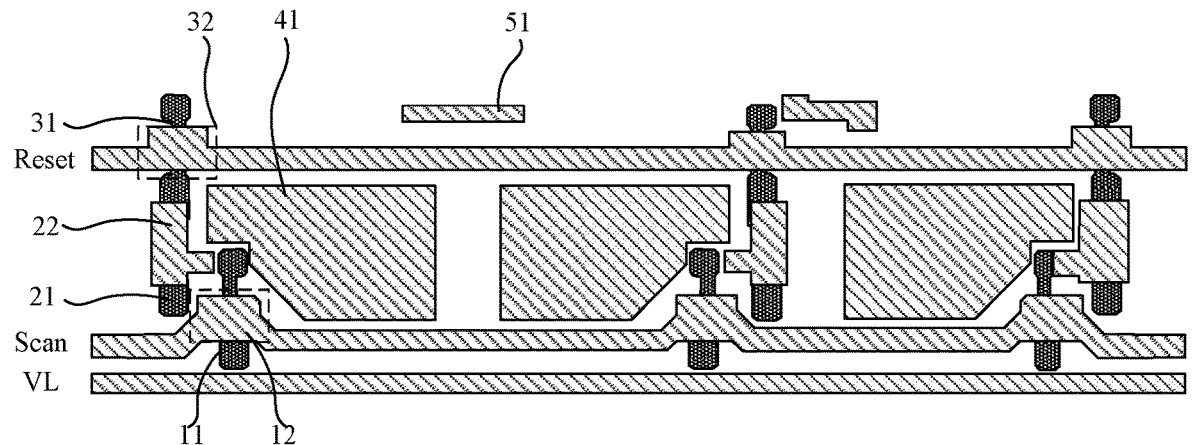
Figure 12:
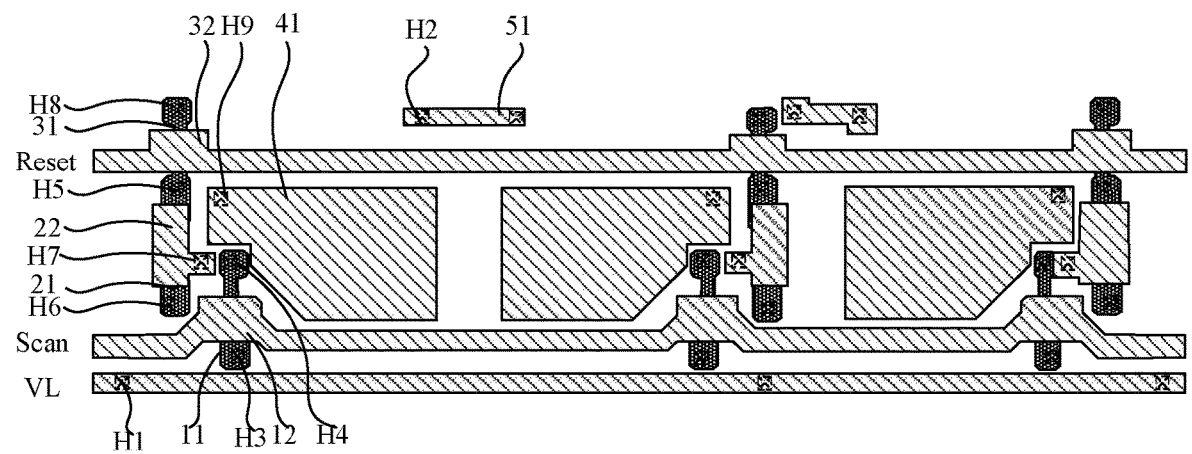

FIG. 10 to FIG. 12 are schematic diagrams of the preparation process of a display substrate according to an exemplary embodiment, illustrating a layout structure of a driving structure of the display substrate, wherein each driving structure includes three driving circuits. A pixel driving circuit in each driving circuit includes: a first transistor T1, a second transistor T2, a third transistor T3, and a storage capacitor.

(1) Forming an active layer on a base substrate, which includes: depositing a first insulating film on the base substrate, patterning the first insulating film through a patterning process to form a first insulating layer, depositing a semiconductor film on the first insulating layer, and patterning the semiconductor film through a patterning process to form an active layer in a display region. The active layer includes a first active layer 11, a second active layer 21, and a third active layer 31, as shown in FIG. 10.

The first active layer 11 serves as an active layer of the first transistor, the second active layer 21 serves as an active layer of the second transistor, and the third active layer 31 serves as an active layer of the third transistor.

In an exemplary embodiment, orthographic projections of the first active layer 11, the second active layer 21, and the third active layer 31 on the base substrate and that of the first electrode plate 41 on the base substrate are arranged at intervals. That is, there is no overlapping region between the first active layer 11 and the first electrode plate 41, between the second active layer 21 and the first electrode plate 41, or between the third active layer 31 and the first electrode plate 41, which benefits a design of a width-to-length ratio of channels of the first transistor, the second transistor, and the third transistor according to relevant requirements.

In an exemplary embodiment, orthographic projections of the first active layer 11, the second active layer 21, and the third active layer 31 on the base substrate and that of the second electrode plate 42 are on the base substrate arranged at intervals. That is, there is no overlapping region between the first active layer 11 and the second electrode plate 42, between the second active layer 21 and the second electrode plate 42, or between the third active layer 31 and the second electrode plate 42, which benefits the design of the width-to-length ratio of channels of the first transistor, the second transistor, and the third transistor according to relevant requirements.

(2) Forming a first metal layer, which includes: depositing a second insulating film on the base substrate on which the active layer is formed, patterning the second insulating film through a patterning process to form a second insulating layer in the display region; depositing a first metal film on the second insulating layer, and patterning the first metal film through a patterning process to form a first metal layer. The first metal layer includes: a reset signal line Reset, a scanning signal line Scan, a first power supply connection line VL, a first reference connection line 51, and a first gate electrode 12, a second gate electrode 22, a third gate electrode 32 and a first electrode plate 41 formed in each driving structure, as shown in FIG. 11.

In an exemplary embodiment, the reset signal line Reset, the scanning signal line Scan, the first power supply connection line VL, and the first reference connection line 51 are parallelly arranged and all extend in the first direction. The reset signal line Reset and the scanning signal line Scan are respectively located on either side of the first electrode plate 41, the first power supply connection line VL is located on a side, away from the first electrode plate 41, of the scanning signal line Scan, and the first reference connection line 51 is located on a side, away from the first electrode plate 41, of the reset signal line Reset.

In an exemplary embodiment, the first gate electrode 12 is an integrated structure connected to the scanning signal line Scan and crosses the first active layer 11. The second gate electrode 22 crosses the second active layer 21. The third gate electrode 32 is an integrated structure connected to the reset signal line Reset, and crosses the third active layer 31.

In an exemplary embodiment, this process further includes a conductive treatment. Conduction treatment is that, after the first metal layer is form, plasma treatment is performed on the active layer using the first gate electrode 12, the second gate electrode 22, and the third gate electrode 32 as covers; the active layer in the region covered by the first gate electrode 12, the second gate electrode 22, and the third gate electrode 32 (i.e., the overlapping region between the active layer and the first gate electrode 12, the second gate electrode 22, and the third gate electrode 32) serves as a channel region of the transistor; the active layer in the region which is not covered by the first metal layer is processed into a conductive layer to form a conductive source and drain region.

(3) Forming a third insulating layer. Forming a third insulating layer includes: depositing a third insulating film on the base substrate on which the first metal layer is formed, and patterning the third insulating film through a patterning process to form the third insulating layer. The third insulating layer is provided with multiple vias. The multiple vias include: a first via H1 at the location of the first power supply connection line VL, a second via H2 at the location of the first reference connection line, a third via H3 and a fourth via H4 located on both sides of the first gate electrode 12, a fifth via H5 and a sixth via H6 located on both sides of the second gate electrode 22, a seventh via H7 at the location of the second gate electrode 22, an eighth via H8 located on one side of the third gate electrode 32, a ninth via H9 at the location of the first electrode plate 41, as shown in FIG. 12.

In an exemplary embodiment, the first via H1 exposes a surface of the first power supply connection line VL, the second via H2 exposes a surface of the first reference connection line 51, and the third via H3 and the fourth via H4 expose surfaces of both terminals of the first active layer 11. The fifth and sixth vias H5 and H6 expose surfaces of both terminals of the second active layer 21, the seventh via H7 exposes a surface of the second gate electrode 22, the eighth via H8 exposes a surface of the third active layer 31, and the ninth via H9 exposes a surface of the first electrode plate 41.

(4) Forming a second metal layer, which includes: depositing a second insulating film on the base substrate on which the third insulating layer is formed, patterning the second insulating film through a patterning process to form the second metal layer in the display region on the third insulating layer. The second metal layer includes: a first power supply line VDD, three data lines Data, a reference signal line Vref, a second reference connection line 61, as well as a first source electrode 13, a first drain electrode 14, a second source electrode 23, a second drain electrode 24, a third source electrode 33, a third drain electrode 34, and a second electrode plate 42 formed in each driving structure. The above content may be understood with reference to FIG. 4.

In an exemplary embodiment, the first power supply line VDD, the data line Data, and the reference signal line Vref are parallelly arranged and extend in the second direction. Two data lines are arranged between the first driving structure and the second driving structure, and another data line and the reference signal line are arranged between the second driving structure and the third driving structure.

In an exemplary embodiment, the first power supply line VDD is electrically connected to the first power supply connection line VL through the first via H1. The second reference connection line 61 is electrically connected to the first reference connection line 51 through the second via H2.

In an exemplary embodiment, the first source electrode 13 is an integrated structure connected to the data signal line Data, so that each data signal line Data is electrically connected to the first source electrode 13 of the driving structure where it is located. The first source electrode 13 is electrically connected to one terminal of the first active layer 11 through the third via H3; the first drain electrode 14 is electrically connected to the other terminal of the first active layer 11 through the fourth via H4; and the first drain electrode 14 is also electrically connected to the second gate electrode 22 and the second electrode plate 42 simultaneously through the seventh via H7, so that the first drain electrode 14, the second gate electrode 22, and the second electrode plate 42 have the same potential.

In an exemplary embodiment, the second source electrode 23 is electrically connected to one terminal of the second active layer 21 and the first electrode plate 41 simultaneously through the fifth via H5 and the ninth via H9, so that the second source electrode 23, the third drain electrode 34, and the first electrode plate 41 have the same potential. The second drain electrode 24 is electrically connected to the other terminal of the second active layer 21 through the sixth via H6.

In an exemplary embodiment, the third source electrode 33 is electrically connected to one terminal of the third active layer 31 through the eighth via H8, and is electrically connected to the reference signal line Vref through the second via H2 simultaneously, thus realizing electrical connection between the third source electrode 33 and the reference signal line Vref.

In an exemplary embodiment, the second source electrode 23, the third drain electrode 34, and the first electrode plate 41 are connected to each other in an integrated structure.

(5) Forming a fourth insulating layer and a flat layer, which includes: depositing a fourth insulating film on the base substrate on which the second metal layer is formed, and then coating a flat film, and etching the fourth insulating film through the mask, exposure and development of the flat film to form a fourth insulating layer, and forming a flat layer arranged on the fourth insulating layer and located in the display region and a transparent region. The fourth insulating layer and the flat layer are provided with multiple vias, and the multiple vias include: a via at the location of the source electrode of the second transistor T2 in each driving structure. The via exposes the surface of the source electrode of the second transistor T2.

(6) Forming a transparent conductive layer, which includes: depositing a transparent conductive film on the base substrate on which the flat layer is formed, patterning the transparent conductive film through a patterning process to form a transparent conductive layer on the flat layer, wherein the transparent conductive layer includes a first electrode formed in each light-emitting element in the display region, and the first electrode is electrically connected to the source electrode of the second transistor T2 through the via on the flat layer.

(7) Forming a pixel define layer, which includes: coating a pixel define film on the base substrate on which the transparent conductive layer is formed, and forming a pixel define layer through mask, exposure and development processes, wherein the pixel define layer is formed in each light-emitting element in the display region, and an opening region exposing an anode is formed in the pixel define layer in each light-emitting element.

(8) Forming an organic light-emitting layer, which includes: forming an organic light-emitting layer in the opening region of the formed pixel define layer and on the pixel define layer, wherein the organic light-emitting layer is electrically connected to the first electrode.

(9) Forming a second electrode, which includes: coating a cathode film on the base substrate on which the organic light-emitting layer is formed, and patterning the conductive film through a patterning process to form a second electrode. A cathode is formed in the display region and covers the organic light-emitting layer in each light-emitting element. In the display region, the second electrode is electrically connected to the organic light-emitting layer.

(10) Forming an encapsulation layer on the base substrate where the second electrode is formed. The encapsulation layer includes a first encapsulation layer made of an inorganic material, a second encapsulation layer made of an organic material, and a third encapsulation layer made of an inorganic material. The first encapsulation layer is arranged on the second electrode, the second encapsulation layer is arranged on the first encapsulation layer, and the third encapsulation layer is arranged on the second encapsulation layer to form a laminated structure of inorganic material/organic material/inorganic material.

In an exemplary embodiment, the first metal layer and the second metal layer may adopt metal materials, such as any one or more of argentum (Ag), copper (Cu), aluminum (Al) and molybdenum (Mo) or others, or alloy materials of the above metals, such as Aluminum neodymium (AlNd) alloy or Molybdenum Niobium (MoNb) alloy, which may have a single-layer structure or a multi-layer composite structure, such as Mo/Cu/Mo. The first insulating layer, the second insulating layer, the third insulating layer, and the fourth insulating layer may adopt any one or more of silicon oxide (SiOx), silicon nitride (SiNx) and silicon oxynitride (SiON), and may be a single layer, a multiple layer, or a composite layer. The first insulating layer is called a buffer layer, which is configured to improve the water and oxygen resistance of the base substrate, the second insulating layer is called a gate insulating layer, and the third insulating layer is called an interlayer insulating layer, and the fourth insulating layer is called a passivation layer.

In an exemplary embodiment, a thickness of the second insulating layer may be smaller than that of the third insulating layer, and the thickness of the first insulating layer may be smaller than a sum of that of the second insulating layer and that of the third insulating layer, so that the capacity of the storage capacitor can be improved on a premise of ensuring the insulating effect.

In an exemplary embodiment, the flat layer may be made of an organic material, and the transparent conductive film may be made of indium tin oxide (ITO) or indium zinc oxide (IZO).

In an exemplary embodiment, polyimide, acrylic or polyethylene terephthalate may be used in the pixel define layer.

In an exemplary embodiment, any one or more of Magnesium (Mg), Argentum (Ag), Aluminum (Al), copper (Cu) and lithium (Li), or an alloy made of any one or more of the above metals may be used in the second electrode.

In an exemplary embodiment, the first insulating layer has a thickness of 3000 to 5000 Angstroms, the second insulating layer has a thickness of 1000 to 2000 Angstroms, the third insulating layer has a thickness of 4500 to 7000 Angstroms, and the fourth insulating layer has a thickness of 3000 to 5000 Angstroms.

In an exemplary embodiment, the thickness of the first metal layer is 80 to 1200 Angstroms, the thickness of the second metal layer is 3000 to 5000 Angstroms, and the thickness of the third metal layer is 3000 to 9000 Angstroms.

In an exemplary embodiment, the active layer may be a metal oxide layer. The metal oxide layer may adopt an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or a double layer, or a multiple layer.

The structure and preparation process shown in the present disclosure are only an exemplary description. In an exemplary embodiment, the corresponding structure may be changed and the patterning process may be increased or reduced according to actual needs. For example, the pixel driving circuit may be 5T1C or 7T1C. For another example, other electrodes or leads may be provided in the film layer structure.

An embodiment of the present disclosure also provides a display apparatus, including a display substrate.

In an exemplary embodiment, the display apparatus may be: a mobile phone, a tablet computer, a television, a display, a laptop computer, a digital photo frame, a navigator or any product or component with a display function.

The display substrate according to the present embodiment is the display substrate according to any one of the previous embodiments, and the display substrates are similar in the implementation principle and effect, which will not be described repeatedly here.

The drawings in the present disclosure only refer to the structures involved in the embodiments of the present disclosure, and other structures may refer to common designs.

For the sake of clarity, the thickness and size of layers or microstructures are exaggerated in the drawings used to describe the embodiments of the present disclosure. It can be understood that when an element such as a layer, film, region or substrate is referred to as being "on" or "under" another element, the element may be "directly" "on" or "under" the another element, or there may be an intervening element.

Although implementations disclosed in the present disclosure are as the above, the described contents are only implementations used for facilitating understanding the present disclosure, and are not used to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined in the appended claims.

What is claimed is:

1. A display substrate, comprising a display region and a non-display region, wherein the display substrate comprises a base substrate, a driving structure layer and a wiring layer which are disposed on the base substrate; the driving structure layer is located in the display region, and the wiring layer is located in the non-display region; the driving structure layer comprises: a first power supply line, a data signal line and a reference signal line which extend along a first direction; the wiring layer comprises a first power supply wiring, a data wiring, and a reference wiring;

the first power supply wiring is electrically connected to the first power supply line, the data wiring is electrically connected to the data signal line, and the reference wiring is electrically connected to the reference signal line;

the first power supply wiring is located on a first side of the display region, and the data wiring is located on a second side of the display region, wherein the second side is different from the first side; the data wiring and the reference wiring are located on a same side of the display region;

for the first power supply line, the data signal line, and the reference signal line with a same length, a resistance of the first power supply line is greater than that of the data signal line and greater than that of the reference signal line.

2. The display substrate of claim 1, wherein, a line width of the first power supply line is greater than that of the data signal line and greater than that of the reference signal line.

3. The display substrate of claim 2, wherein the driving structure layer further comprises: a plurality of first power supply connection lines located in the display region and extending along a second direction; the plurality of first power supply connection lines and the first power supply line are arranged in different layers;

there is an overlapping region between an orthographic projection of at least one first power supply connection line on the base substrate and that of the first power supply line on the base substrate; each of the at least one first power supply connection line is electrically connected to the first power supply line.

4. The display substrate of claim 2, wherein the driving structure layer further comprises: a plurality of scanning signal lines and reset signal lines extending along a second direction, and a plurality of driving structures arranged in a matrix, and the first power supply line is arranged between two adjacent driving structures;

wherein, each driving structure comprises a first driving circuit, a second driving circuit, and a third driving circuit which are arranged along the second direction.

5. The display substrate of claim 4, further comprising a gate driving circuit located in the non-display region; wherein the gate driving circuit is located on a third side of the display region, and the third side is different from the first side and the second side;

the gate driving circuit is electrically connected to a scanning signal line and a reset signal line respectively, and is configured to provide a signal to the scanning signal line and the reset signal line;

the gate driving circuit comprises a plurality of shift registers, each of which comprises a first shift register and a second shift register; wherein the first shift register is electrically connected to the scanning signal line, and is configured to provide a signal to the scanning signal line; the second shift register is electrically connected to the reset signal line, and is configured to provide a signal to the reset signal line; a plurality of first shift registers are cascaded and a plurality of second shift registers are cascaded.

6. The display substrate of claim 5, further comprising a scanning wiring and a reset wiring; wherein the scanning wiring is electrically connected to the scanning signal line and the gate driving circuit respectively, and the reset wiring is electrically connected to the reset signal line and the gate driving circuit respectively;
the gate driving circuit comprises a plurality of shift register groups, each shift register group comprises at least one shift register; all shift registers in each shift register group are arranged along the first direction;
the plurality of shift register groups are arranged in a stepped manner, and a distance between adjacent shift registers along the second direction is greater than a sum of a length of the scanning wiring and a length of the reset wiring.

7. The display substrate of claim 4, wherein in each driving structure, the data signal line comprises a first data line, a second data line, and a third data line; the first data line is electrically connected to the first driving circuit, the second data line is electrically connected to the second driving circuit, and the third data line is electrically connected to the third driving circuit; the reference signal line is electrically connected to the first driving circuit, the second driving circuit, and the third driving circuit respectively;
the first data line and the second data line are located between the first driving circuit and the second driving circuit, and the second data line is located on one side, close to the second driving circuit, of the first data line; the third data line and the reference signal line are located between the second driving circuit and the third driving circuit, and the third data line is located on one side, close to the third driving circuit, of the reference signal line; or
the first data line and the reference signal line are located between the first driving circuit and the second driving circuit, and the first data line is located on one side, close to the second driving circuit, of the reference signal line; the second data line and the third data line are located between the second driving circuit and the third driving circuit, and the third data line is located on one side, close to the third driving circuit, of the second data line.

8. The display substrate of claim 7, wherein in each driving structure, the first driving circuit and the third driving circuit are mirror symmetrical with respect to a center line of the first data line and the third data line.

9. The display substrate of claim 4, comprising a first driving structure, a second driving structure, and a third driving structure which are adjacently arranged along the second direction;
the third driving circuit in the first driving structure and the first driving circuit in the second driving structure are mirror symmetrical with respect to a first power supply line located between the first driving structure and the second driving structure;
the third driving circuit in the second driving structure and the first driving circuit in the third driving structure are mirror symmetrical with respect to a first power supply line located between the second driving structure and the third driving structure.

10. The display substrate of claim 4, wherein the driving structure layer further comprises a first reference connection line and a second reference connection line which extend along the second direction;
the first reference connection line and the second reference connection line are arranged in different layers; and the second reference connection line is electrically connected to the reference signal line and the first reference connection line respectively.

11. The display substrate of claim 10, wherein each driving structure comprises two first reference connection lines arranged along the second direction and three second reference connection lines arranged along the second direction;
a first one of the two first reference connection lines is electrically connected to a first one and a second one of the three second reference connection lines respectively;
a second one of the two first reference connection lines is electrically connected to the second one and a third one of the three second reference connection lines respectively;
one of the three second reference connection lines is electrically connected to the reference signal line, and the one of the three second reference connection lines and the reference signal line form a continuous integrated structure.

12. The display substrate of claim 1, further comprising a second power supply line and a second power supply wiring which are located in the non-display region; wherein
the second power supply line is electrically connected to the second power supply wiring, the second power supply line extends along a second direction, the second direction intersects with the first direction; the second power supply line and the second power supply wiring are located on a same side of the display region, and the second power supply wiring and the data wiring are located on a same side of the display region.

13. The display substrate of claim 12, wherein the second power supply line and the reference wiring are arranged in different layers, and there is an overlapping region between an orthographic projection of the second power supply line on the base substrate and that of the reference wiring on the base substrate;
the second power supply line is electrically connected to the reference wiring.

14. The display substrate of claim 12, further comprising: a source driving chip and at least one bonding pad which are located in the non-display region, and a flexible circuit board; the bonding pad and the first power supply wiring are located on a same side of the display region, and the source driving chip and the data wiring are located on a same side of the display region; the source driving chip is located on one side, away from the display region, of the second power supply line;
the source driving chip is electrically connected to the data wiring and is configured to provide a data signal to the data signal line through the data wiring,
the flexible circuit board is electrically connected to the bonding pad and the second power supply wiring respectively, and is configured to supply power to the first power supply wiring through the bonding pad, and supply power to the second power supply wiring.

15. The display substrate of claim 12, further comprising a source driving chip and at least one bonding pad which are located in the non-display region, a peripheral circuit board, a flexible signal line; wherein the bonding pad and the first power supply wiring are located on a same side of the display region, and the source driving chip and the data wiring are located on a same side of the display region; the source driving chip is located on one side, away from the display region, of the second power supply line;

the source driving chip is electrically connected to the data wiring and is configured to provide a data signal to the data signal line through the data wiring;

the peripheral circuit board is electrically connected to the bonding pad, the second power supply wiring, and the source driving chip through the flexible signal line respectively, and is configured to supply power to the first power supply wiring through the bonding pad, and supply power to the second power supply wiring, and provide a signal to the source driving chip.

16. The display substrate of claim 1, further comprising a light-emitting structure layer located on one side, away from the base substrate, of the driving structure layer, wherein the light-emitting structure layer comprises a plurality of light-emitting elements;

each driving circuit in the driving structure layer comprises a pixel driving circuit configured to drive a light-emitting element to emit light;

the pixel driving circuit comprises: a first transistor, a second transistor, a third transistor, and a storage capacitor; the second transistor is a driving transistor, and the storage capacitor comprises a first electrode plate and a second electrode plate;

a control electrode of the first transistor is electrically connected to a scanning signal line, a first electrode of the first transistor is electrically connected to a data signal line, and a second electrode of the first transistor is electrically connected to a first node; a control electrode of the second transistor is electrically connected to a first node, a first electrode of the second transistor is electrically connected to a first power supply line, and a second electrode of the second transistor is electrically connected to a second node; a control electrode of the third transistor is electrically connected to a reset signal line, a first electrode of the third transistor is electrically connected to a reference signal line, a second electrode of the third transistor is electrically connected to the second node, the first electrode plate of the storage capacitor is electrically connected to the second node; and the second electrode plate of the storage capacitor is electrically connected to the first node;

a first electrode of the light-emitting element is electrically connected to the second node, and a second electrode of the light-emitting element is electrically connected to a second power supply line.

17. The display substrate of claim 16, wherein the driving structure layer comprises a first insulating layer, an active layer, a second insulating layer, a first metal layer, a third insulating layer, and a second metal layer which are sequentially arranged along a direction perpendicular to the base substrate;

the active layer comprises active layers of all transistors; the first metal layer comprises: a first reference connection line, control electrodes of all transistors, the first electrode plate, a reset signal line, a scanning signal line, and a first power supply connection line; the second metal layer comprises: a second reference connection line, a reference signal line, a data line, the second electrode plate, and first and second electrodes of all transistors.

18. The display substrate of claim 17, wherein the third insulating layer is provided with a first via exposing the first power supply connection line and a second via exposing the first reference connection line; and the first power supply line is electrically connected to the first power supply connection line through the first via, and the second reference connection line is electrically connected to the first reference connection line through the second via;

or, wherein the second power supply line is disposed in a same layer as the scanning signal line;

a connection via exposing the second power supply line is arranged on the third insulating layer; and the reference wiring is electrically connected to the second power supply line through the connection via.

19. The display substrate of claim 1, wherein a length of the data wiring is negatively correlated with that of the data signal line;

or, wherein a shape of the display region is circular, elliptical, fan-shaped, heart-shaped, triangular or N-polygonal, wherein N is greater than 4.

20. A display apparatus, comprising: the display substrate of claim 1.

* * * * *